United States Patent
Inoue

(10) Patent No.: US 9,214,488 B2
(45) Date of Patent: Dec. 15, 2015

(54) SOLID STATE IMAGING DEVICE

(71) Applicant: KABUSHIKI KAISHA TOSHIBA, Minato-ku (JP)

(72) Inventor: Ikuko Inoue, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/200,755

(22) Filed: Mar. 7, 2014

(65) Prior Publication Data

US 2015/0035103 A1 Feb. 5, 2015

(30) Foreign Application Priority Data

Aug. 1, 2013 (JP) .................. 2013-160565

(51) Int. Cl.
*H01L 27/146* (2006.01)
(52) U.S. Cl.
CPC ........ *H01L 27/1464* (2013.01); *H01L 27/1469* (2013.01); *H01L 27/14641* (2013.01); *H01L 27/14636* (2013.01)
(58) Field of Classification Search
CPC .................................. H01L 27/1464
USPC .......................................... 257/292
See application file for complete search history.

(56) References Cited

U.S. PATENT DOCUMENTS

| | | | | |
|---|---|---|---|---|
| 4,831,431 A | * | 5/1989 | Hanlon | 341/126 |
| 5,210,438 A | * | 5/1993 | Nakamura | 257/536 |
| 8,698,934 B2 | * | 4/2014 | Hagiwara | 348/308 |
| 2008/0258250 A1 | | 10/2008 | Uenishi | |
| 2010/0096677 A1 | | 4/2010 | Inoue | |
| 2011/0062540 A1 | | 3/2011 | Saito et al. | |
| 2012/0242876 A1 | | 9/2012 | Hagiwara | |

FOREIGN PATENT DOCUMENTS

| | | |
|---|---|---|
| JP | 2010-98219 | 4/2010 |
| JP | 2011-61092 | 3/2011 |
| JP | 2012-204403 | 10/2012 |
| JP | 2013-115289 A | 6/2013 |
| TW | 200939464 | 9/2009 |
| TW | 201101468 | 1/2011 |
| TW | 201143058 | 12/2011 |

OTHER PUBLICATIONS

Office Action issued Mar. 6, 2015 in Korean patent Application No. 10-2014-0023874 (with English translation).
Office Action issued Jul. 9, 2015 in Taiwanese Patent Application No. 103107053 (with English translation).

* cited by examiner

*Primary Examiner* — Mark Prenty
(74) *Attorney, Agent, or Firm* — Oblon, McClelland, Maier & Neustadt, L.L.P.

(57) ABSTRACT

According to one embodiment, a solid state imaging device includes a semiconductor substrate comprising a first surface and a second surface opposite the first surface; a circuit at a side of the first surface of the semiconductor substrate; a pixel in the semiconductor substrate and converting light from a side of the second surface into electric charge; and an element at a side of the second surface of the semiconductor substrate. The pixel includes a photo diode in the semiconductor substrate at the side of the first surface, and the photo diode includes a diffusion layer in an impurity region in the semiconductor substrate at the side of the first surface.

8 Claims, 19 Drawing Sheets

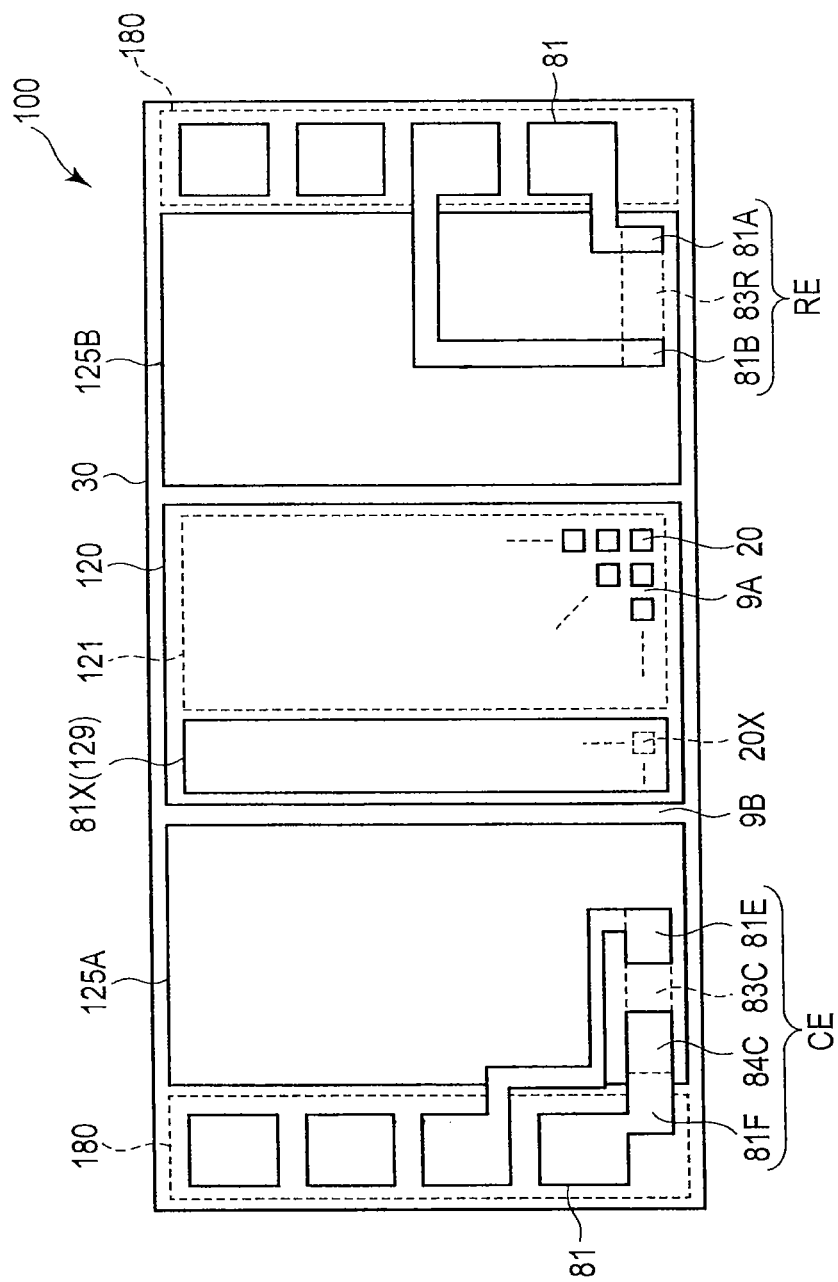
F I G. 3

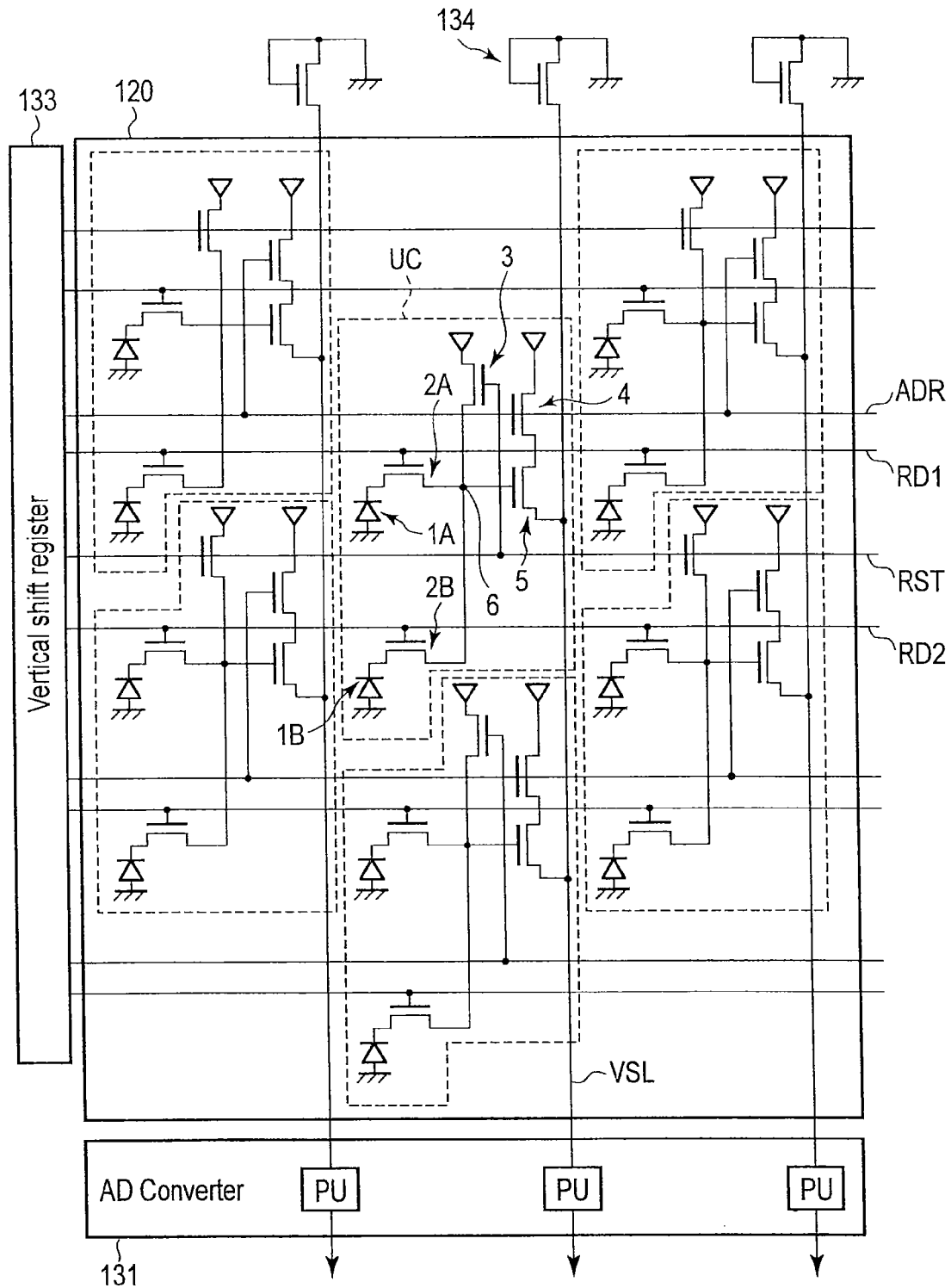
F I G. 5

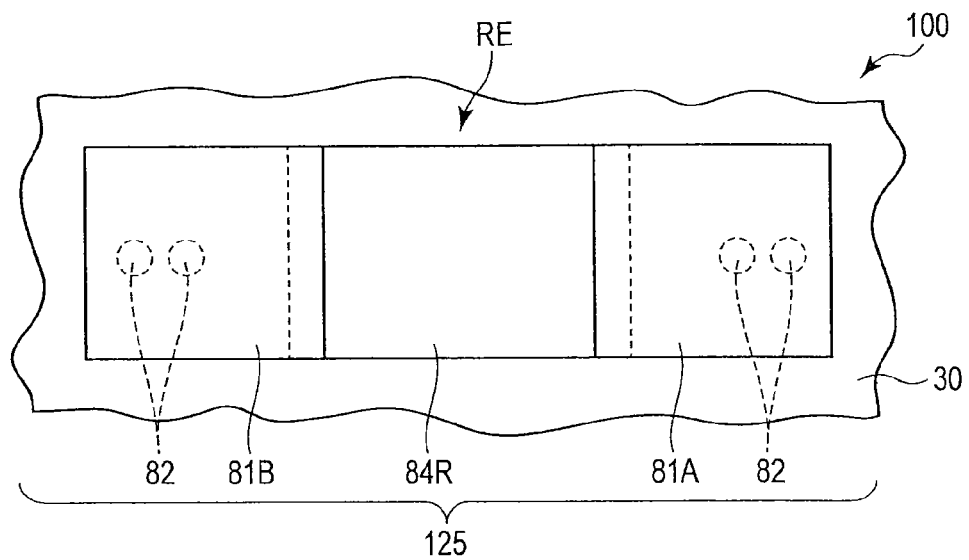
F I G. 17A
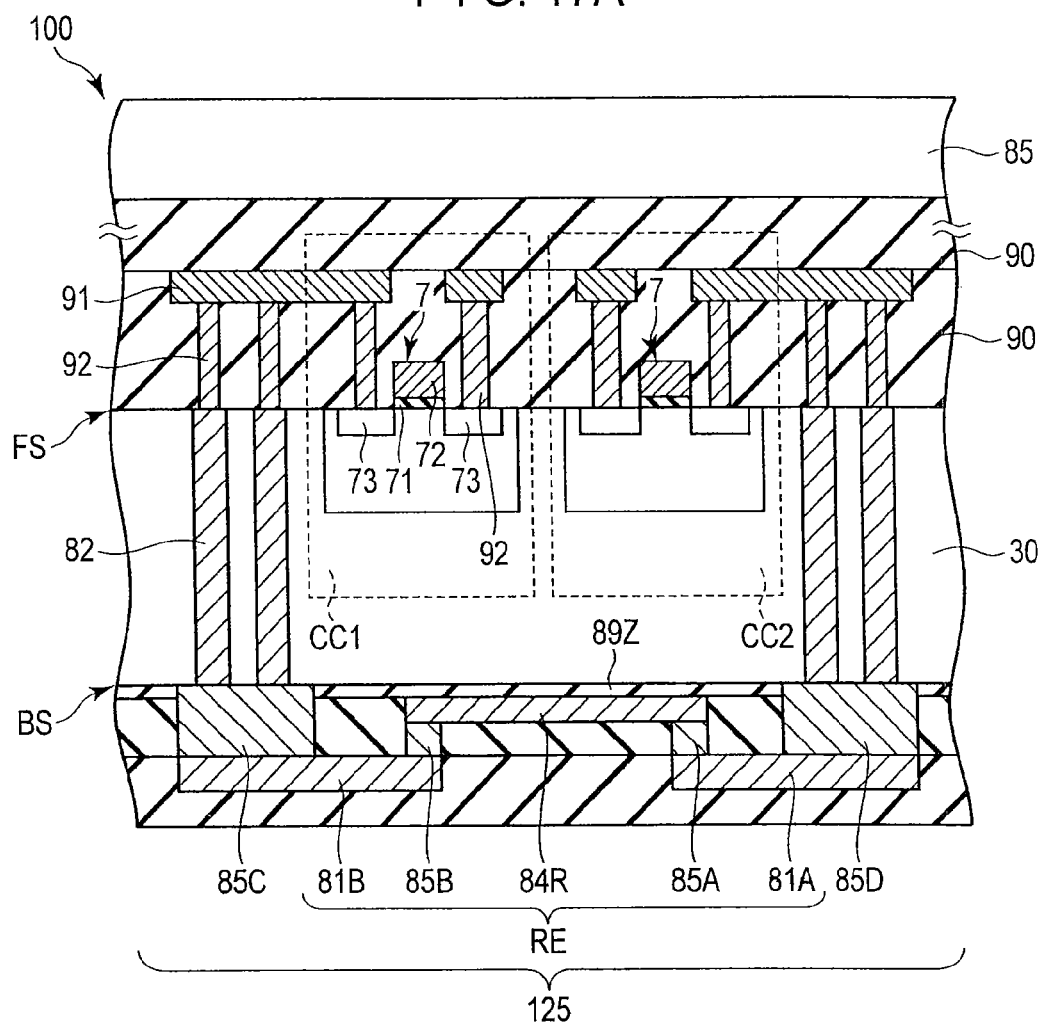
F I G. 17B

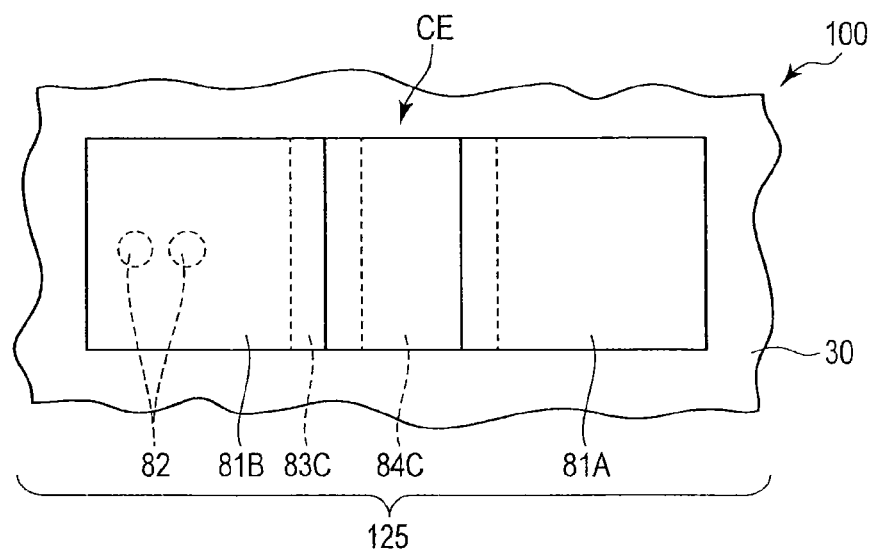
F I G. 18A
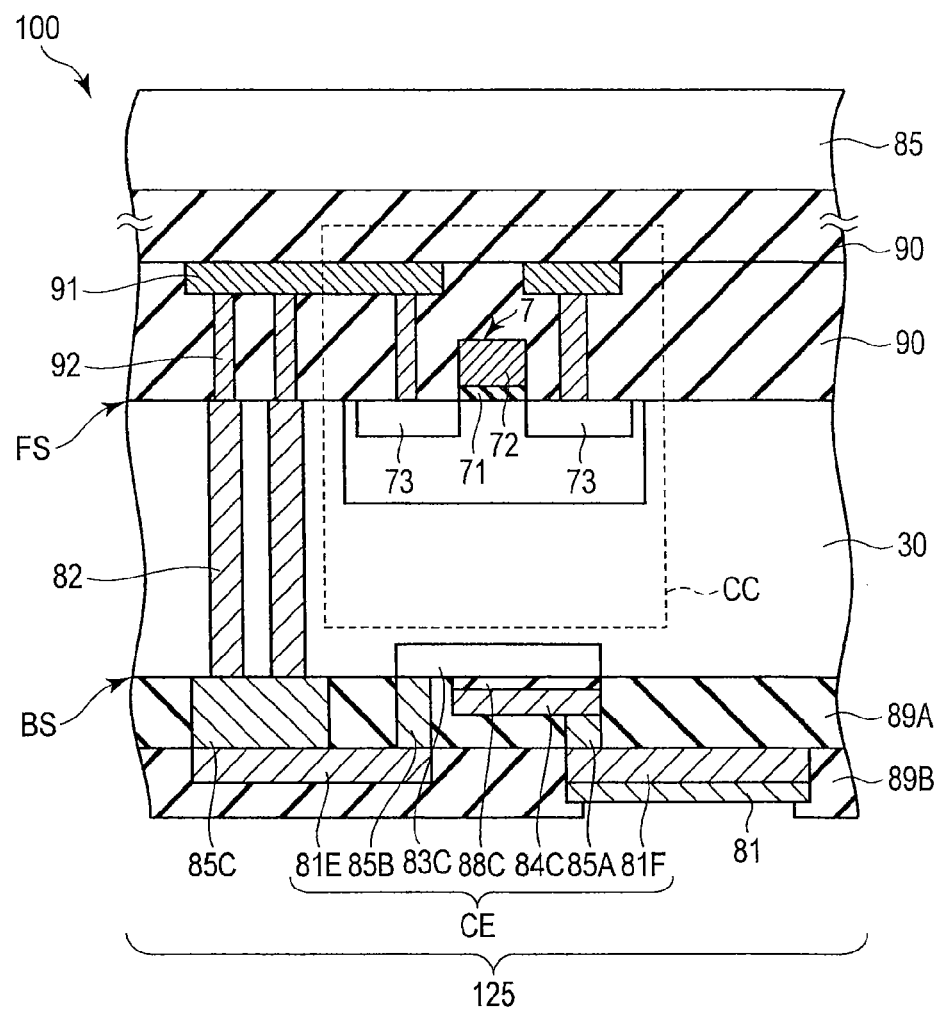
F I G. 18B

SOLID STATE IMAGING DEVICE

CROSS-REFERENCE TO RELATED APPLICATIONS

This application is based upon and claims the benefit of priority from prior Japanese Patent Application No. 2013-160565, filed Aug. 1, 2013, the entire contents of which are incorporated herein by reference.

FIELD

Embodiments relate to a solid state imaging device.

BACKGROUND

Solid state imaging devices, such as a charge coupling device (CCD) image sensor and a complementary metal oxide semiconductor (CMOS) image sensor are used for various usages, such as a digital still camera, a video camera, or a surveillance camera.

A back-illuminated image sensor can eliminate obstacles to light, such as interconnects between pixels and micro lenses, and therefore can increase the sensitivity of the pixels to incident light and reduce optical shading.

Therefore, development of the back-illuminated image sensor has been promoted in recent years.

BRIEF DESCRIPTION OF THE DRAWINGS

FIG. 3 is a plan view schematically illustrating a structure example of the solid state imaging device of the embodiment;

FIG. 5 is an equivalent circuit diagram illustrating a configuration example of a pixel array of a solid state imaging device;

FIGS. 17A and 17B schematically illustrate a specific example of a solid state imaging device of the embodiment;

FIGS. 18A and 18B schematically illustrate a specific example of a solid state imaging device of the embodiment;

DETAILED DESCRIPTION

According to one embodiment, a memory device comprises: a semiconductor substrate comprising a first surface and a second surface opposite the first surface; a circuit at a side of the first surface of the semiconductor substrate; a pixel in the semiconductor substrate and converting light from a side of the second surface into electric charge, the pixel comprising a photo diode in the semiconductor substrate at the side of the first surface, the photo diode comprising a diffusion layer in an impurity region in the semiconductor substrate at the side of the first surface; and an element at a side of the second surface of the semiconductor substrate.

Embodiments will now be described in detail with reference to the figures. In the following description, components which have an identical function and configuration will be indicated by the same reference signs and a duplicate description will be given when necessary.

Embodiment

Referring to FIGS. 1 to 20, a solid state imaging device according to an embodiment will be described.

(1) Structure

The structure of the solid state imaging device according to the embodiment will be described with reference to FIGS. 1 to 5.

Figure 1:
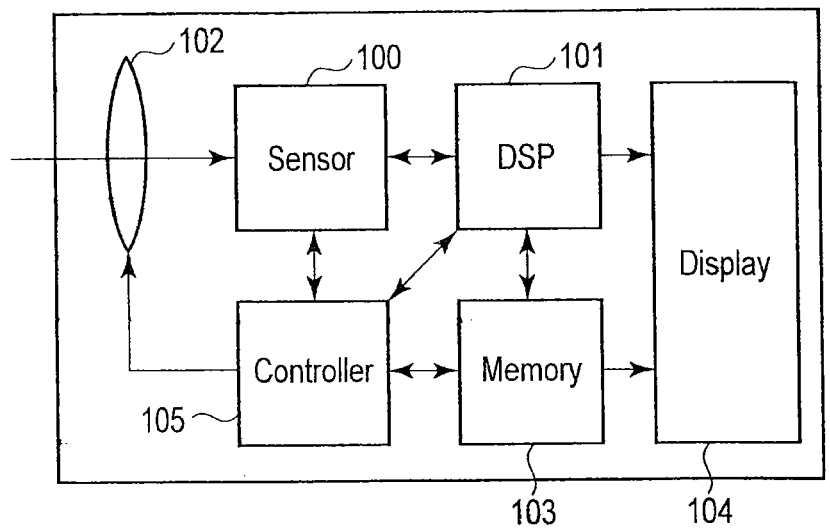
FIG. 1 illustrates an example of a module including a solid state imaging device of one embodiment.
Figure 2:
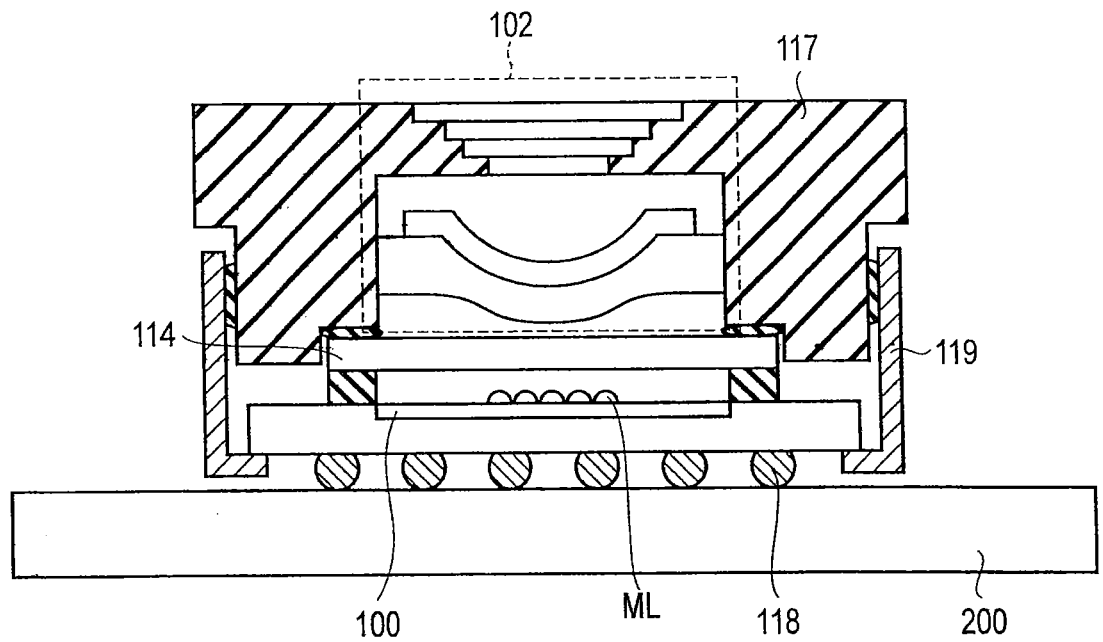
FIG. 2 illustrates another example of a module including a solid state imaging device of the embodiment.

FIGS. 1 and 2 are schematic diagrams illustrating the solid state imaging device of the present embodiment. FIG. 1 is a block diagram illustrating a configuration example of a module including the solid state imaging device (for example, image sensor) 100 of the present embodiment. FIG. 2 is a sectional view schematically illustrating a structure example of the module including the image sensor 100 of the present embodiment. A module with the image sensor 100 of the present embodiment therein will be referred to as a camera module hereinafter.

As illustrated in FIG. 1, the camera module has the image sensor 100 therein. The camera module of FIG. 1 includes a digital signal processor (DSP) 101, an optical lens unit 102, a memory 103, a display 104, and a controller 105 as well as the image sensor 100, for example.

The image sensor 100 converts incident light (i.e., light from an object of images) corresponding to an image to an electronic signal. The optical lens unit 102 collects the incident light (or, light from an object) in the image sensor 100, and forms an image corresponding to the incident light on the image sensor 100. The optical lens unit 102 includes multiple lenses. With mechanical or electrical control of each lens, the optical property (for example, a focal length) of the optical lens unit 102 can be controlled.

The DSP (or, a signal conditioning circuit) 101 processes the electrical signal output from the image sensor 100. The memory 103 stores a signal from DSP 101. The memory 103 can also store a signal and data given from the outside.

The display 104 displays the signal from the DSP 101 or memory 103. The signal from DSP 101 and the memory 103 are image data (i.e., still or moving image data) corresponding to the light from the object obtained by the image sensor 100. The controller 105 controls operation of components 101 to 104 in the camera module.

As illustrated in FIG. 2, the image sensor 100 is made as a single package or module and is provided on a circuit board (also referred to as a printed circuit board, a module board, or a flexible substrate) 200. The chip of the image sensor 100 is made into a single package with a substrate, such as lead frames and a ball grid array (BGA), for example. The substrate will be referred to as a package substrate hereinafter.

A lens holder 117 with the optical lens unit 102 therein is attached to the image sensor 100. The light from the optical lens unit 102 is illuminated to an array of pixels of the image sensor 100 through the microlens array ML attached to the image sensor 100.

A stack 114 of, for example, a filter and a protective film, is bonded between the image sensor 100 and optical lens unit 102 by adhesives.

A camera module with the image sensor 100 therein is coupled to connectors (not shown) or interconnects (not shown) formed in the circuit board 200 by electrodes 118, such as solder balls and pins. With this, the camera module is coupled to another device (for example, a module or package) on the circuit board 200. A shield unit 119 is attached to the image sensor 100 and a lens holder 117 to cover the sides of the image sensor 100. The DSP 101, memory 103, and controller 105 may be provided, for example, on the same substrate (for example, a package substrate or circuit board) as the image sensor 100, or on a substrate different form that of the image sensor 100 as long as they are electrically coupled to the image sensor 100. The DSP 101, memory 103, and controller 105 may be provided outside the shield unit 119, and or in the shield unit 119.

Figure 4:
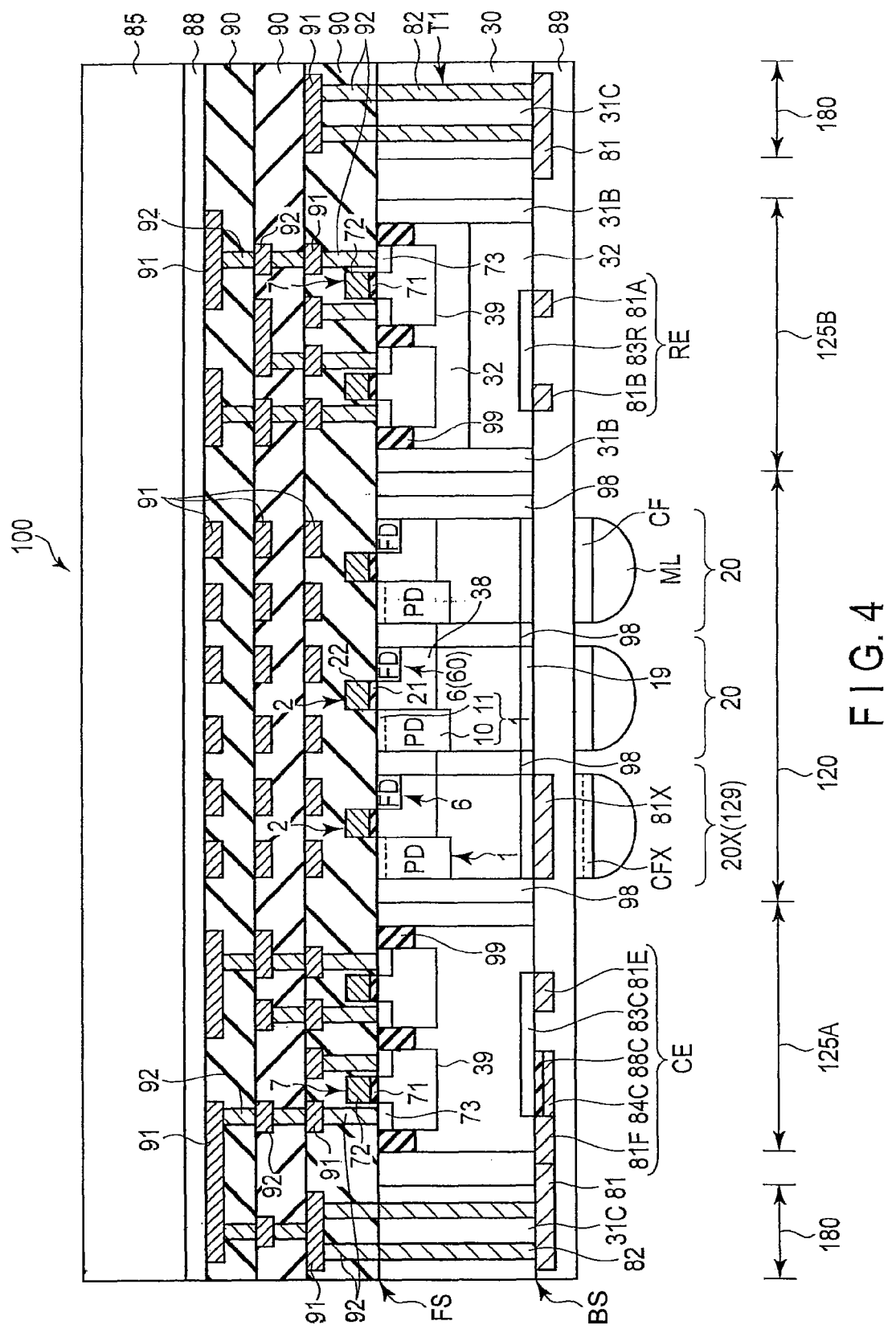
FIG. 4 is a sectional view schematically illustrating a structure example of the solid state imaging device of the embodiment.

Referring to FIGS. 3 to 5, the structure of the image sensor 100 of the present embodiment will be described. FIG. 3 is a view schematically illustrating the plane structure of the image sensor 100 of the present embodiment. FIG. 4 is a view schematically illustrating a cross-sectional structure of the image sensor 100 of the present embodiment.

As illustrated in FIGS. 3 and 4, in the image sensor 100 of present embodiment, a pixel array 120 and areas 125A and 125B in which circuits for driving the pixel array 120, which will be referred to as peripheral circuit areas, are provided in a single semiconductor substrate (chip) 30. The semiconductor substrate 30 has a first surface FS and a second surface BS, which faces the first surface FS along a direction perpendicular to the first surface FS.

The image sensor 100 of the present embodiment takes in light from an object from the second surface BS side of the semiconductor substrate 30. The image sensor 100 of the present embodiment has transistors in a circuit of the image sensor and an interlayer dielectric 90 for multilayer interconnection structure provided at the first surface FS side of the semiconductor substrate 30, and passive elements RE and CE for the image sensor 100 provided at the second surface BS side of the semiconductor substrate 30.

The pixel array 120 includes multiple unit cells 20. Each unit cell 20 includes a pixel (also referred to as a photoelectric transducer) for converting incident light from the outside into an electrical signal. A unit cell 20 includes at least a single pixel. In the peripheral circuit areas 125A and 125B, there are provided logic circuits and analog circuits, more specifically a circuit for controlling operation of the pixel array 120 and a circuit for processing signals from the pixel array 120.

Adjacent unit cells 20 and pixels therein are separated by element isolation regions 9A. An area in which each unit cell 20 and a pixel is formed is enclosed by an element isolation region 9A. Between the pixel array 120 and peripheral circuit areas 125A and 125B, there are provided element isolation regions 9B.

In the present embodiment, pixels are formed with photo diodes. A photo diode corresponds to a pixel. For example, a photo diode 1 as a pixel is used to form a complementary metal oxide semiconductor (CMOS) sensor or a charge coupling device (CCD) sensor.

An example of an internal configuration of the pixel array 120 will now be described with reference to FIG. 5. FIG. 5 is a figure illustrating an example of the circuit configuration of the pixel array 120 and a circuit in its vicinity.

As illustrated in FIG. 5, multiple unit cells UC are arranged in the pixel array 120 in a matrix form. Each unit cell UC is provided in an intersection of read control lines RD1, RD2, and a perpendicular signal line VSL.

The unit cells UC illustrated in FIG. 5 each have a two-pixel per cell structure, where a unit cell UC includes two pixels. In a unit cell UC of the two-pixel per cell structure, a single floating diffusion 6 is common for two photo diodes 1A and 1B.

Each unit cell UC includes, for example, two read transistors 2A and 2B, a reset transistor 3, an address transistor 4, and an amplifier transistor 5. In the unit cell UC of the two-pixel per cell structure, the two read transistors 2A and 2B are provided for the photo diodes 1A and 1B, respectively. In the unit cell UC of the two-pixel per cell structure, the reset transistor 3, address transistor 4, and amplifier transistor 5 are shared by the two photo diodes 1A and 1B.

The cathodes of the photo diodes 1A and 1B are coupled to the floating diffusion 6 via current paths of the read transistor 2A and 2B, respectively. The photo diodes 1A and 1B convert light incident thereto through the micro lenses and color filters into signal electric charges (or, an electrical signal), and accumulate them. When the photo diodes 1A and 1B are not distinguished, they are hereinafter referred to as the photo diodes 1.

The read transistors 2A and 2B control accumulation and transmission of the signal electric charges of respective photo diodes 1A and 1B. The gates of the read transistors 2A and 2B are coupled to read control lines RD1 and RD2, respectively. Ends of current paths of the read transistors 2A and 2B are coupled to the cathodes of the photo diodes 1A and 1B, respectively. The other ends of the current paths of the read transistors 2A and 2B are coupled to the floating diffusion G. When the read transistors 2A and 2B are not distinguished, they are hereinafter referred to as the read transistors 2.

The reset transistor 3 resets the potential of the floating diffusion 6, or the gate potential of the amplifier transistor 5. The gate of the reset transistor 3 is coupled to a reset control line RST. One end of the current path of the reset transistor 3 is coupled to the floating diffusion 6, and the other end of the current path of the reset transistor 3 is coupled to the power supply terminal.

The address transistor 4 serves as a select element for selecting, or activating, a unit cell UC. The gate of the address transistor 4 is coupled to an address control line ADR. One end of the current path of the address transistor 4 is coupled to the other end of the current path of the amplifier transistor 5, and the other end of the current path of the address transistor 4 is coupled to the power supply terminal.

The amplifier transistor 5 amplifies the signal from the photo diode 1 stored by the floating diffusion 6. The gate of the amplifier transistor 5 is coupled to the floating diffusion 6. One end of the current path of the amplifier transistor 5 is coupled to a perpendicular signal line VSL, and the other end of the current path of the amplifier transistor 5 is coupled to one end of the current path of the address transistor 4. The signal amplified by the amplifier transistor 5 is output to the perpendicular signal line VSL as a signal of the unit cell, or pixel.

The vertical shift register 133 is coupled to two read control lines RD1 and RD2, an address control line ADR, and a reset control line RST in each row. The vertical shift register 133 controls the potentials (or, signal levels) of the read control lines RD1 and RD2, address control lines ADR and reset control lines RST, and controls and selects multiple unit cells UC (and pixels) in the pixel array 120 in units of rows.

An AD converter 131 is coupled to the perpendicular signal lines VSL. The AD converter 131 includes process units PU for converting analog signals from the unit cells UC into digital signals, and performing a correlated double sampling (CDS) process to the signals from the unit cells UC.

A load transistor 134 is used as a current source for a perpendicular signal line VSL. The end of the current path of the load transistor 134 is coupled to the end of the current path of an amplifier transistor 3 via the perpendicular signal line VSL. The other end of the current path of the load transistor 134 is coupled to a power supply terminal (for example, a ground terminal). The gate of the load transistor 134 is coupled to the other end of the current path of that load transistor 134.

A unit cell UC may not include an address transistor 4. In this case, in each unit cell UC, the other end of the current path of the reset transistor 3 is coupled to the other end of the current path of the amplifier transistor 5. When a unit cell UC does not include the address transistor 4, address signal line ADR is also not provided.

A unit cell UC may have a one-pixel per cell structure including a single pixel, or a circuit configuration such as a multi-pixel per cell structure where a unit cell includes three or more pixels (or, photo diodes) such as a four-pixel per cell structure or eight-pixel per cell structure. In a unit cell including multiple pixels, three or more photo diodes share a floating diffusion and a reset transistor, an amplifier transistor and an address transistor. In a unit cell including multiple pixels, a single read transistor is provided for every photo diode.

In FIG. 4, among components of a unit cell 20, only the photo diode 1, read transistor 2, and floating diffusion 6 are illustrated for simplified illustration.

As illustrated in FIG. 4, each photo diode 1 is formed in the semiconductor substrate (or, semiconductor layer) 30 in an area in which a unit cell 20 of the pixel array 120 is formed and which will be referred to as a unit cell formation area 20. The photo diode 1 is formed from at least one impurity layer (or, an impurity semiconductor layer or an impurity semiconductor region) 10 formed in the semiconductor substrate 30 of an N (or P) type. At least one impurity layer 10 of the photo diode 1 has a conductivity type of an N type. The photo diode 1 may be, however, formed with multiple impurity layers with different conductivity types and impurity concentrations in order to increase the property (for example, sensitivity) of the photo diode 1. The electric charges which have been converted by the photo diode 1 and are based on the quantity of incident light are generated and accumulated in the impurity layer 10 of the photo diode 1.

For example, in the surface (or, upper surface) of the impurity layer 10 of the photo diode 1, there is provided a P-conductivity-type impurity layer, which will be hereinafter referred to as a surface shield layer 11. The surface shield layer 11 controls deterioration of the property of the photo diode 1 resulting from impurities, such as generation of dark current.

In a semiconductor region (of the P-type, for example) 38 in the semiconductor substrate 30, an impurity layer 60 as the floating diffusion 6 is provided. The impurity layer 60 of the floating diffusion 6 has a conductivity type of, for example, the N-type. The impurity layer 60 as the floating diffusion 6 has the electric charge output from the photo diode 1 via the read transistor 2 stored (or, accumulated) therein.

Between a photo diode 1 and a floating diffusion 6, a read transistor 2 is provided on the semiconductor substrate 30. A gate electrode 22 of the read transistor 2 is provided on a P-type impurity region (to be referred to as a P-type region) 38 of the semiconductor substrate 30 with a gate insulator 21 therebetween. For example, impurity layers (not shown) formed in the semiconductor region 38 are used as the source/drain of the read transistor 2. The impurity layer included in the photo diode 1 or the impurity layer as the floating diffusion 6 may be used as the source/drain of the read transistor 2.

An element isolation layer 98 in the element isolation region 9A is provided in the semiconductor substrate 30 to surround each of unit cells 20 and photo diodes 1. With the element isolation layer 98, adjacent unit cells 20 and photo diodes 1 are electrically isolated. The element isolation layer 98 in the pixel array 120 is formed, for example, of an impurity layer, which will be referred to as an element isolation impurity layer. The impurity layer 98 as the element isolation layer has a conductivity type of, for example, the P-type. The element isolation layer 98 in the pixel array 120 may be an insulator of shallow trench isolation (STI) structure (an element isolation insulator).

In the peripheral circuit areas 125A and 125B, there are provided circuits, such as the AD converter 131 of FIG. 5 and vertical shift register 133, for example.

The peripheral circuit areas 125A and 125B are electrically isolated from the pixel array 120 by the element isolation regions 9B, for example. In each area 9B for isolating the peripheral circuit areas 125A and 125B, an element isolation insulator 99 of the STI structure is buried, or isolation impurity layers 31B and 98 are provided, for example.

For example, for a case of the peripheral circuit area 125A being an analog circuit area, a P-type impurity region (or, P-type region) 31A is provided in the semiconductor substrate 30 of the analog circuit area 125A. For example, the P-type region 31A is coupled to a metal layer (not shown) to which the earth (or, ground) potential is applied. The metal layer for applying the earth potential to the P-type region 31A may be provided at the first surface FS side, or at the second surface BS side.

For example, for a case of the peripheral circuit area 125B being a logic circuit area, an N-type impurity region (or, N-type region) 32 is provided in the semiconductor substrate 30 of the logic circuit area 125B. In the logic circuit area 125B, the P-type region 31B surrounds the N-type region 32. The P-type regions 31A and 31B of the peripheral circuit areas 125A and 125B reach from the first surface FS of the semiconductor substrate 30 to the second surface BS thereof.

P or N-type well regions 39 are provided in the P-type region 31A of the analog circuit area 125A and the N-type region 32 of the logic circuit area 125B. In the well regions 39, components of the peripheral circuit of the image sensor 100, such as a field-effect transistor, are provided. Field effect transistors 7 as components of the peripheral circuit are illustrated in FIG. 4.

In the analog and logic circuit areas 125A and 125B, the field effect transistors (for example, MOS transistors) 7 are provided in the well regions 39. In each well region 39, two impurity (or, diffusion) layers 73 as source/drains of the transistor 7 are provided. Above the well region 39 between the two diffusion layers 73, a gate electrode 72 is provided with a gate insulator 71 therebetween. Each well region 39 between the two diffusion layers 73 is the channel region of a transistor 7. Whether the field-effect transistor 7 is a P or N-channel type or an enhancement or depletion type is based on the conductivity type of the well region 39 in which the field-effect transistor 7 is provided, or the conductivity type of the impurity regions (or, diffusion layers) 73 as the source or drain.

In the example described above, the P-type region 31A in the analog circuit area 125A and the N-type region 32 in the logic circuit area 125B are illustrated; however peripheral circuit areas 125A and 125 may also include both P-type and N-type regions, and an N-type region may be provided in the analog circuit area 125A, and a P-type region may be provided in the logic circuit area 125B. In the following description, when the peripheral circuit areas 125A and 125B are not distinguished, they are referred to as the peripheral circuit areas 125.

Multiple interlayer dielectrics (for example, silicon oxide) 90 are stacked on the semiconductor substrate 30 to cover respective gate electrodes 22 and 72 of the transistors 2 and 7 and the upper surfaces (or, surface shield layers 11) of the photo diodes 1.

A multilayer interconnection technique is used for the image sensor 100 of the present embodiment. Specifically, conductive layers 91 are provided in respective stacked interlayer dielectrics 90 in accordance with interconnect levels (or, heights from a main surface of the substrate). A conductive layer 91 is electrically coupled to another conductive layer 91 in an upper or lower interconnect level with one of plugs 92 buried in the interlayer dielectrics 90. The conductive layers 91 are metal layers including copper (Cu) or aluminum (aluminum), for example. For example, a conductive layer 91 of copper (or a copper alloy) has the damascene structure, and is buried in a trench (or, a damascene trench) formed in an interlayer dielectric 90.

For example, the gate electrodes 22 and 72 and source/drains 73 of the transistors 2 and 7, and terminals of elements on the semiconductor substrate 30 are coupled to conductive layers (or, interconnects) 91 at the interconnect level lowest from the semiconductor substrate 30, or the bottom level, via the contact plugs 92. Conductive layers 91 in an insulator 90 are coupled to conductive layer 91 at the upper or lower level interconnect layers via the plugs 92, thereby elements on the semiconductor substrate 30 are coupled to each other. With this, circuits included in the image sensor 100 are formed.

In addition to the interconnects to couple elements and circuits, the conductive layers 91 include dummy layers which are coupled to no element or circuit and shade layers which prevent light from being incident to the photo diodes. The dummy layers are provided in an interlayer dielectric in order to adjust a rate of coverage for the interlayer dielectric of each interconnect level, or a ratio of an area of a particular area and that a metal pattern in that region.

Thus, with the multilayer interconnection technique, the stacked interlayer dielectrics 90 include multilayer interconnects 91 at respective interconnect levels.

On the top interlayer dielectric 90, a support substrate 85 is provided. The support substrate 85 is stacked on the interlayer dielectric 90 with, for example, an adhesive layer (or, a protective layer or a planarization layer) 88 therebetween. A silicon substrate and an insulating substrate are used for the support substrate 85, for example. The support substrate 85 supports the back-illuminated image sensor 100.

Interconnects (not shown) formed by a re-distribution technique may be provided between the support substrate 85 and interlayer dielectric 90. An interconnect formed by the re-distribution technique will be hereinafter referred to as a re-distribution layer.

In the present embodiment, the surface, or first surface, FS of the semiconductor substrate 30, on which gate electrodes 22 and 72 of respective transistors 2 and 7 are provided, is referred to as a front surface of the semiconductor substrate 30. On the front surface FS of the semiconductor substrate 30, the interlayer dielectrics 90 formed with the multilayer interconnect technique are provided. The interlayer dielectrics 90 are provided between the semiconductor substrate 30 and support substrate 85. In the present embodiment, the surface, or the second surface, BS of the semiconductor substrate 30 opposite the front surface FS is referred to as a back surface BS of the semiconductor substrate 30. FIG. 3 schematically illustrates the plane structure of the image sensor when seen from the back surface BS. When front surface FS and back surface BS of the semiconductor substrate 30 are not distinguished, those surfaces will be hereinafter referred to as main surfaces.

In the present embodiment, as illustrated in FIG. 4, the back surface BS of the semiconductor substrate 30 is provided with a color filter layer CF with a planarization layer 89 therebetween. The color filter layer CF is provided where the color filter layer CF and the pixel array 120 overlap with respect to a direction perpendicular to the main (or, front and back) surfaces of the semiconductor substrate 30. The planarization layer 89 is at least a single insulating film with a function as a protective and adhesive layer.

For example, a single plate type image sensor obtains multiple color-information-items with a single pixel array 120. In this case, the color filter layer CF has, for example, a filter (also referred to as a pigment film) which allows light in the wavelength band corresponding to red (R) to penetrate, a filter which allows light in the wavelength band corresponding to green (G) to penetrate, and a filter which allows light in the wavelength band corresponding to blue (B) to penetrate for a single pixel (or, photo diode 1). A filter for one of red, blue and green is provided in the color filter layer CF to align a single photo diode 1 (or, unit cell 20).

Each filter of the color filter layer CF is arranged to have a predetermined pattern. In addition, the color filter layer CF may have a filter which allows light in the wavelength band corresponding to yellow (Y) to penetrate as well as red, green, and blue, or a filter of white (W) which allows the entire wavelength band of visible light to penetrate. The color filter layer CF has a predetermined arrangement pattern, such as the Bayer arrangement and WRGB arrangement, for example.

A microlens array ML is attached to the color filter layer CF with a protective layer (not shown) and an adhesive layer (not shown) therebetween.

The microlens array ML is provided above the pixel array 120 at the back surface BS side of the semiconductor substrate 30 with the color filter layer CF therebetween with respect to a direction perpendicular to the main surfaces of the semiconductor substrate 30. The microlens array ML is formed of two-dimensionally arranged micro lenses, one for each pixel (or, photo diode 1). Each micro lens concentrates incident light to each pixel 1.

The surface with the color filter layer CF and microlens array ML attached thereto is the back surface BS of the semiconductor substrate 30. The semiconductor substrate 30 with elements formed thereon lies between the interlayer dielectrics 90 and microlens array ML. Thus, in the image sensor 100 of the present embodiment, the microlens array ML and color filter layer CF are provided on the surface (i.e., back surface) BS opposite the surface (i.e., front surface) FS on which the gate electrodes 22 and 72 of the transistors 2 and 7 and interlayer dielectrics 90 are provided. The light from an object is illuminated to the pixel array 120 from the back surface BS side of the semiconductor substrate 30 via the microlens array ML and color filter layer CF.

An image sensor with a structure where light from an object is illuminated to the photo diodes from the back surface BS side opposite the front surface FS of the semiconductor substrate 30 on which the interlayer dielectric 90 (and support substrate 85) is provided, such as the image sensor 100 of the present embodiment, is referred to as a back-illuminated image sensor.

For example, a shade layer 81X is provided on the back surface BS of the semiconductor substrate 30, covering a unit cell 20X. The area 129 covered with the shade layer 81X in the pixel array 120 is an optical black area 129, which will be hereinafter referred to as an OB area or a shielding area. The unit cell 20X in the OB area 129 generates a reference potential applied to the pixel array 120 (for example, reset transistors or amplifier transistors) or a potential (or current) for correcting a dark current in the unit cells 20 in the valid area 129. The areas 121 in the pixel array 120 other than the OB area 129 will be hereinafter referred to as a valid area 121.

For example, in the OB area 129, a stack of films CFX of several filters for different colors is provided where the films CFX and the shade layer 81X overlap vertically. This improves the light blockage for the OB area 129. When the stack of films of filters CFX is provided in the OB area 129, the shade layer 81X may not be provided in the OB area 129. A micro lens may not be formed in the OB area 129.

For example, an impurity layer 19 as a shield layer is provided in the semiconductor substrate 30 in the pixel array 120 at the back surface BS side of the semiconductor substrate 30. The shield layer (to be referred to as a back surface shield layer hereinafter) 19 at the back surface BS side of the semiconductor substrate 30 suppresses impurities resulting from layers 89, 81X and CF between the microlens array ML and semiconductor substrate 30 from diffusing into the semiconductor substrate 30. This suppresses deterioration of the property of the components 2, 3, and 6 of the unit cell 20 resulting from diffusion of the impurities from the back surface BS side of the semiconductor substrate 30.

Pads on the front surface FS of the semiconductor substrate 30 and pads 81 and 81A on the back surface BS side of the semiconductor substrate 30 serve for inputting and outputting of signals between the image sensor 100 and an external device, or providing voltage to the image sensor 100.

For example, the conductive layer (or, interconnect) 91 in the top interlayer dielectric 90, the re-distribution layer (not shown) on the top interlayer dielectric 90, or a metal layer (not shown) on (or inside) the support substrate 85 is used for the pads at the front surface FS side of the semiconductor substrate 30. The pads on the front surface FS side of the semiconductor substrate 30 on which an image sensor is formed will be hereinafter referred to as a front surface side pad. The back-illuminated image sensor may not be provided with the surface side pad.

As illustrated in FIGS. 3 and 4, multiple contact areas 180 are provided at the ends of the semiconductor substrate 30 (or, edge portions of the semiconductor substrate 30). The contact areas 180 adjoin the pixel array 120 and peripheral circuit areas 125A and 125B, for example. FIG. 3 illustrates an example where the contact areas 180 are provided at the ends of the semiconductor substrate 30 in a direction in which the pixel array 120 and peripheral circuit areas 125A and 125B adjoin. However, according to the layout in the chip of the image sensor 100, the contact areas 180 may be provided at the ends of the semiconductor substrate 30 in a direction perpendicular to the direction in which the pixel array 120 and peripheral circuit areas 125A and 125B adjoin, or may be provided along edges of a quadrangular chip to surround the pixel array 120 and the peripheral circuit areas 125A and 125B.

The contact areas 180 include P or N-type impurity regions 31C in the semiconductor substrate 30. A through silicon via (TSV) technique is used to form holes (or, openings) T1 to penetrate from the front surface FS side of the semiconductor substrate 30 toward the back surface BS side of the semiconductor substrate 30 in the contact areas 180.

The holes T1 are buried with through electrodes (also referred to as through vias) 82. An insulator (not shown) is provided on the side (or, side walls) in each through hole T1 to electrically insulate that through electrode 82 from the semiconductor substrate 30. The through electrodes 82 are coupled to the lowest conductive layers 91 in the interlayer dielectric 90 via the plugs 92 in the lowest (i.e., the nearest to the front surface FS side of the semiconductor substrate 30) interlayer dielectric 90. For example, one or more through electrodes 82 and one or more through holes are provided in each contact area 180.

On the back surface BS of the semiconductor substrate 30, multiple pads 81 are provided in each contact area 180.

A single pad 81 is coupled to one or more through electrodes 82. An insulator (not shown) is provided between the pads 81 and the back surface BS of the semiconductor substrate 30 to electrically isolate the pads 81 from the semiconductor substrate 30.

The pads 81 are coupled to the conductive layers (for example, interconnects 91 of the lowest interconnect level) on the front surface FS of the semiconductor substrate 30 via the through electrode 82 and plugs 92 in the interlayer dielectric 90. The pads 81 on the back surface BS of the semiconductor substrate for forming the image sensor 100 will be hereinafter referred to as back surface side pads 81.

For example, power supply pads for applying a drive voltage (or, supply voltage) Vdd or ground voltage (or, ground voltage) Vss to an image sensor, pads for inputting and outputting signals, and pads to be coupled to a test pin or monitor pin are provided in the image sensor 100 as the surface side pads and back surface side pads 81.

The through electrodes 82 are formed with a semiconductor (for example, polysilicon) including impurities of a high concentration. The back surface side pads 81 are formed with a metal layer (for example, a metal with aluminum or copper as the main ingredient therein). For example, the back surface side pads 81 are formed substantially simultaneously with the shade layer 81X, and are formed with the same material as the shade layer 81X, i.e., a metal with aluminum or copper as the main ingredient therein. The through electrodes 82 may be formed with a metal.

The back surface side pads 81 and contact areas 180 are arranged along each edge of the chip 30 of the image sensor 100. The direction in which the back surface side pads 81 and 81A are arranged in each edge of the chip will hereinafter be referred to as a pad array direction.

For example, metal layers (to be referred to as back surface side interconnects hereinafter) as interconnects are provided on the back surface BS of the semiconductor substrate 30. The back surface side interconnects are formed substantially simultaneously with and with the same material as the back surface side pads 81 and shade layer 81X at the back surface BS side of the semiconductor substrate 30.

For example, at the ends in the contact areas 180 of the semiconductor substrate 30, a guard ring (not shown) is provided in a trench (or a through hole) in the semiconductor substrate 30. For example, the guard ring is formed in substantially the common process with the through electrodes 82. In this case, the guard ring is formed with the same material as the through electrodes 82.

As illustrated in FIGS. 3 and 4, in the back-illuminated image sensor 100 of the present embodiment, elements CE and RE are provided at the back surface BS side of the semiconductor substrate 30. The elements CE and RE at the back surface BS side of the semiconductor substrate 30 are passive elements, and are, for example, capacitance element CE or resistance element RE.

The capacitance element CE and resistance element RE at the back surface BS side of the semiconductor substrate 30 (i.e., the side from which light from an object is received) in the present embodiment will be hereinafter referred to as a back surface side capacitance element CE and a back surface side resistance element RE for clarification of description. Moreover, when the back surface side capacitance element CE and back surface side resistance element RE are not distinguished, the elements at the back surface BS side of the semiconductor substrate 30 will be referred to as back surface side passive elements or back surface side elements.

The back surface side passive elements CE and RE are coupled to the back surface side pads 81 or through electrodes 82 via the back surface side interconnects 81A, 81B, 81E, and 81F.

In the present embodiment, the back surface side capacitance element CE and back surface side resistance element RE are provided in a peripheral circuit area 125 at the back surface BS side of the semiconductor substrate 30. The back surface side capacitance element CE and back surface side resistance element RE are provided where they overlap, vertically to the main surfaces of the substrate, the circuit and elements (for example, transistors) provided at the front surface FS side of the semiconductor substrate 30.

For example, a back surface side capacitance element CE includes a diffusion layer 83C in the semiconductor region 31A at the back surface BS side of the semiconductor substrate 30, an insulator (or, a dielectric) 88C on the diffusion layer 83C at the back surface side of the semiconductor substrate 30, and a metal layer 84C on the insulator 88C at the back surface side of the semiconductor substrate 30. For example, for a case of the semiconductor region 31A being a grounded P-type region, the diffusion layer 83C of the capacitance element CE is an N-type diffusion layer.

The diffusion layer 83C and metal layer 84C in the back surface side capacitance element CE are opposite to each other with the insulator 88C therebetween. The diffusion layer 83C and metal layer 84C are used as electrodes of the capacitance element CE. The diffusion layer 83C and metal layer 84C of the capacitance element CE will be hereinafter referred to as capacitor electrodes 83C and 84C. The insulator 88C between the capacitor electrodes 83C and 84C will be referred to as a capacitor insulator (or, a capacitor dielectric) 88C.

In order to form a capacitance element CE of a predetermined electric capacity, at least one of the opposing area of the diffusion layer 83C as an electrode of capacitance element CE and the metal layer 84, the thickness of the capacitor insulator 88C, and the materials (or, dielectric constant) of the capacitor insulator 88C is controlled.

A metal layer 81E as a terminal (or, the back surface side interconnect) of the capacitance element CE is coupled to the diffusion layer 83C as the capacitor electrode of the back surface side capacitance element CE directly or via a contact unit (not shown). The back surface side interconnect 81F is coupled to the metal layer 84C as the capacitor electrode of the back surface side capacitance element CE directly or via a contact unit (not shown).

The back surface side capacitance element CE is coupled to the back surface side pad 81 via a contact unit and back surface side interconnects 81E and 81F, or to the circuit at the front surface side of the semiconductor substrate 30 via the through electrodes 82 and interconnects 81E, 81F, and 91. The back surface side capacitance element CE is used for a capacitance element of a peripheral circuit, or capacitor for stabilizing the power supply, etc.

For a case of the semiconductor region having therein the diffusion layer 83C of the back surface side capacitance element CE being an N-type region, the diffusion layer 83C as the capacitor electrode is a P-type diffusion layer.

For example, the back surface side resistance element RE includes a diffusion layer (for example, P-type diffusion layer) 83R in the semiconductor region (for example, N-type region) 32 at the back surface side of the semiconductor substrate 30, and metal layers 81A and 81B on the diffusion layer 83R at the opposing ends at the back surface side of the semiconductor substrate 30. The metal layers 81A and 81B of the back surface side resistance element RE are coupled to the diffusion layer 83R of the back surface side resistance element RE directly or via contact units (not shown). The metal layers 81A and 81B may be in direct contact with the diffusion layer 83R.

The diffusion layer 83R in the back surface side resistance element RE is used as a resistive body of the resistance element RE.

For example, the metal layers 81A and 81B of the back surface side resistance element RE are used as terminals of the resistance element RE. For example, the metal layers 81A and 81B may be continuous with the back surface side interconnects to couple the back surface side resistance element RE to the back surface side interconnects.

The back surface side resistance element RE is coupled to the back surface side pads 81 via contact units (not shown) and the back surface side interconnects 81A and 81B, or to the circuit at the front surface side of the semiconductor substrate 30 via the through electrodes 82 and the interconnects 91. The back surface side resistance element RE is used as a resistance element for adjusting voltages, or a resistance element in the peripheral circuit, for example.

For a case of the semiconductor region having therein the diffusion layer 83R of the back surface side resistance element RE being a P-type region, the diffusion layer 83R is an N-type diffusion layer.

Only the capacitance element CE and resistance element RE at the back surface BS side of the semiconductor substrate 30 may be used to form a circuit with a particular function (for example, a filter or delay circuit) at the back surface BS side of the semiconductor substrate 30.

FIGS. 3 and 4 illustrate an example of the capacitance element CE and resistance element RE as the back surface side passive elements each being coupled between back surface side pads 81; however the back surface side passive elements CE and RE may be coupled to the interconnects, elements, and circuits at the front surface FS side of the semiconductor substrate 30 as will be described.

For example, an inductive element (or, inductor) may be provided at the back surface BS side of the semiconductor substrate 30 as a back surface side element of the image sensor of the present embodiment. Not all the passive elements for the back-illuminated image sensor 100 need to be provided at the back surface BS side of the semiconductor substrate 30, but a resistance element and a capacitance element may be provided at the front surface FS side of the semiconductor substrate 30. FIGS. 3 and 4 illustrate an example of a single resistance element and a single capacitance element being provided for simplification of illustration; however multiple resistance elements and multiple capacitance elements may be provided at the back surface BS side of the semiconductor substrate 30. As the back surface side passive elements, only resistance elements or capacitance elements may be provided at the back surface BS side of the semiconductor substrate 30.

The back-illuminated image sensor of the present embodiment is configured with the passive elements CE and RE provided at the back surface BS side of the semiconductor substrate 30 from which light from an object is received.

As in the image sensor of the present embodiment, the elements CE and RE of the image sensor 100 are provided at the back surface BS side of the semiconductor substrate 30 to vertically overlap a circuit and elements provided at the front surface FS side of the semiconductor substrate 30 in a direction perpendicular to the main surfaces of the semiconductor substrate 30. This can reduce an area occupied by the passive elements in the chip 30 of the image sensor 100 in a direction parallel to the main surfaces of the semiconductor substrate 30 in the present embodiment. As a result, the image sensor 100 of the present embodiment can reduce the size of the chip of the image sensor.

The camera module having therein the image sensor of the present embodiment can place elements to be provided on the circuit board with a camera module thereon in a general camera module at the back surface side of an image sensor, which can reduce an area on the circuit board 200 where passive elements are arranged. As a result, the camera module with the image sensor 100 of the present embodiment therein can reduce the size of the camera module.

Moreover, according to the present embodiment, the reduced size of the chip and module can reduce the cost of an image sensor and camera module.

As described, the solid state imaging device (i.e., a camera module with an image sensor and an image sensor therein) of the present embodiment can reduce the size of the solid state imaging device.

(2) Manufacturing Method

Referring to FIGS. 6 to 13, a manufacturing method of a solid state imaging device (for example, an image sensor) of the present embodiment will be described.

FIGS. 6 to 13 are views each schematically illustrating a cross-sectional structure in each process of the manufacturing method of the image sensor of the present embodiment. In addition to FIGS. 6 to 13, FIGS. 1 to 4 are also used to describe each process of the manufacturing method of the image sensor of the present embodiment when necessary. In the manufacturing method of the image sensor of the present embodiment, an order for below-mentioned components to be formed may be suitably varied as long as the conformity of the process is secured.

Figure 6:
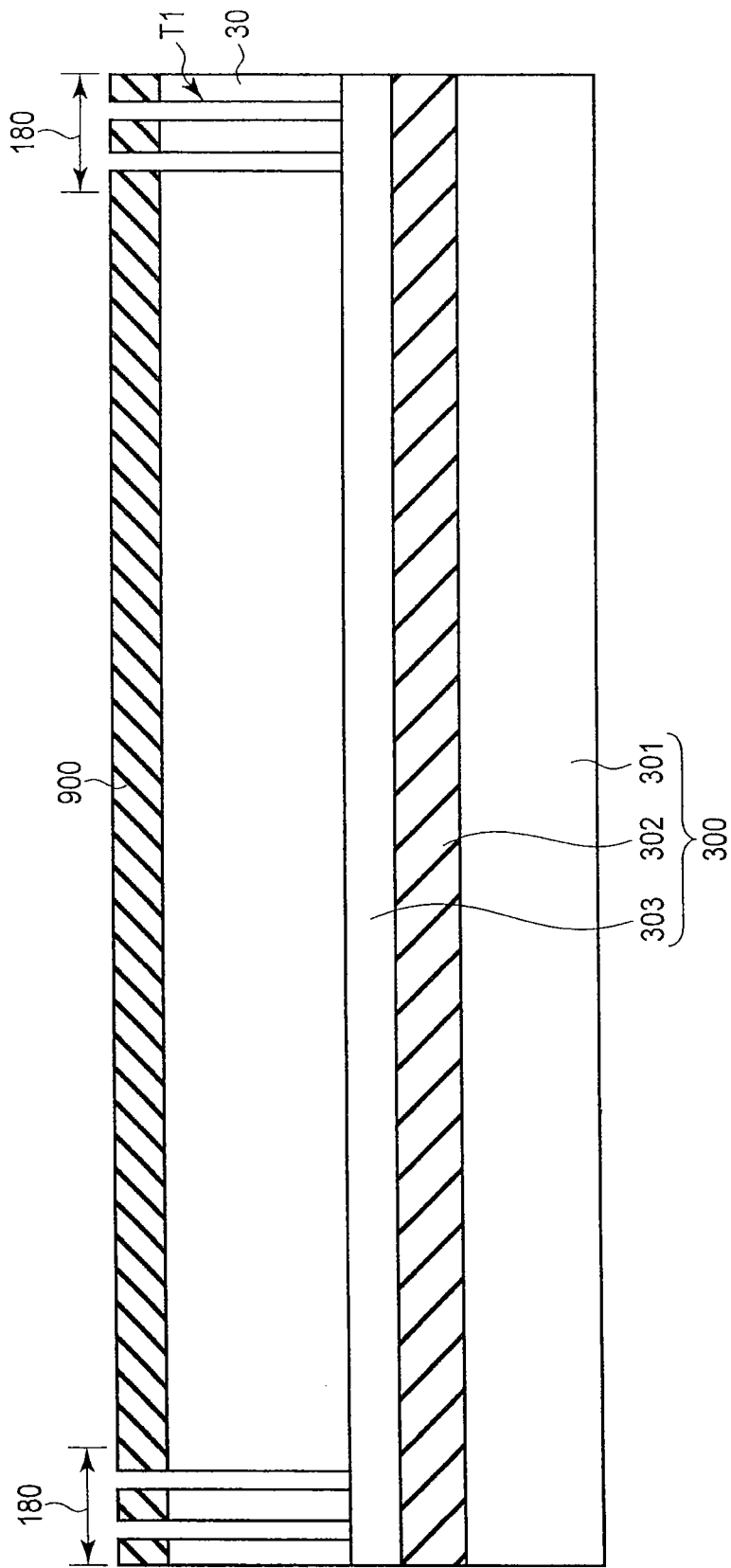
FIGS. 6 to 13 are figures each for describing one process in a manufacturing process of a solid state imaging device of the embodiment.

As illustrated in FIG. 6, the semiconductor layer 30 is formed on the substrate 300. For example, the substrate 300 is a silicon on insulator (SOI) substrate 300. The SOI substrate 300 includes a buried oxide (BOX) layer 302 as an insulator on the semiconductor substrate (for example, silicon substrate) 301, and an SOI layer 303 on the BOX layer 302. The SOI layer 303 is a crystal layer (or, an epitaxial layer) of a thickness of about 50-100 nm. The SOI layer 303 includes N-type dopants of a concentration of about $1\times10^{15}$-$1\times10^{17}$ $cm^{-3}$.

The semiconductor layer 30 lies on the SOI layer 303. The semiconductor layer 30 is an epitaxial layer 30 of the N-type, for example. The epitaxial layer 30 on the SOI layer 303 has a thickness of about 3-8 μm, for example. The epitaxial layer 30 includes N-type dopants with a concentration of about $1\times10^{14}$-$1\times10^{17}$ $cm^{-3}$, for example.

The epitaxial layer 30 on the SOI layer 303 will be used as the semiconductor substrate 30 on which the image sensor 100 of the present embodiment will be formed.

On the epitaxial layer 30, a silicon oxide (not shown) is formed with chemical vapor deposition (CVD) or thermal oxidation. On the silicon oxide on the epitaxial layer 30, a silicon nitride (not shown) is formed with, for example, the CVD. On the epitaxial layer 30A, a hard mask layer (not shown) of a stack of a silicon oxide and a silicon nitride is formed.

A resist layer 900 is applied on the hard mask layer. By photolithography and etching, openings for exposing the epitaxial layer 30 are formed in the resist layer 900. The openings of the resist layer 900 are formed where the via holes (or, through holes) penetrating the front and back surfaces of the epitaxial layer 30 will be formed. During this, an opening is formed in the resist layer 900 where a guard ring will be formed.

With the resist layer 900 with the openings formed therein used as a mask, holes T1 as the through holes in which through electrodes will be buried in the epitaxial layer 30 to reach the BOX layer 302 or SOI layer 303 in the contact formation areas 180 are formed. Simultaneously with the formation of the trenches T1, the trench in which the guard ring will be buried is formed. For example, the trenches T1 are formed to penetrate the epitaxial layer 303 to expose the upper surfaces of the SOI layer 303 where the trenches T1 were formed.

Figure 7:
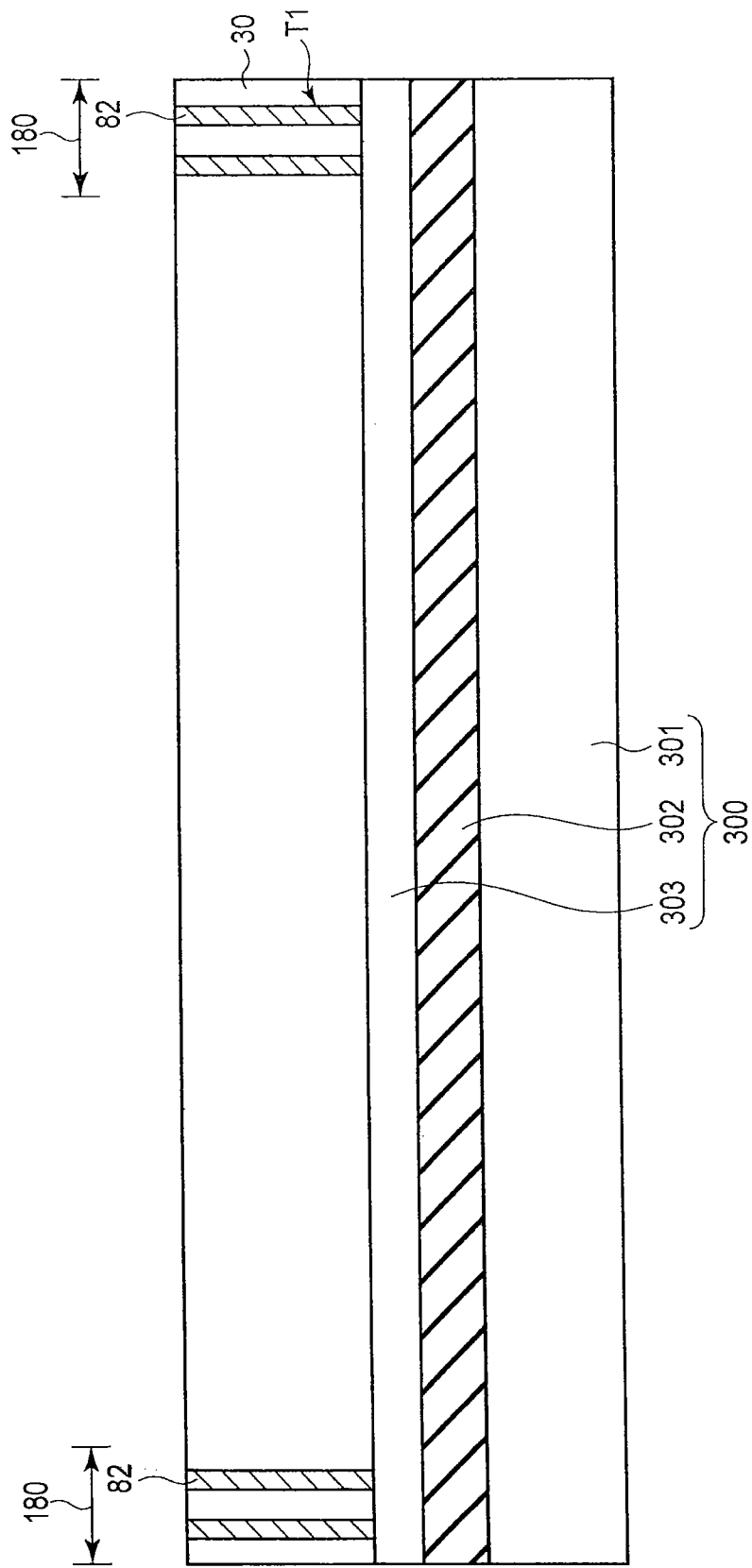

As illustrated in FIG. 7, after removal of the resist layer, the epitaxial layer 30 exposed in each formed trench (or, through hole) T1 is oxidized to form an oxide (not shown) on the internal surface (or, side wall) of the trench T1 in the epitaxial layer 30. On the internal surface (or, oxide) of each trench T1 in the epitaxial layer 30, a silicon nitride (not shown) is formed by, for example, the CVD, without filing the trench T1 with the silicon nitride. The silicon nitride may be formed by a nitriding process.

Then, a polysilicon layer 82 with doped high-concentration impurities is buried in each trench T1 in the epitaxial layer 30 by, for example, the CVD and chemical mechanical polishing (CMP).

With the process illustrated in FIGS. 6 and 7, the conductive material 82 which will serve as the through electrode which reaches the back surface side of the epitaxial layer (or, semiconductor substrate) from the front surface side 30 is formed in each trench (or, through hole) T1 of the epitaxial layer 30.

The number of trenches T1 and through electrodes 82 formed in the contact formation areas 180 may differ based on where the pads will be formed in each contact formation area 180.

Figure 8:
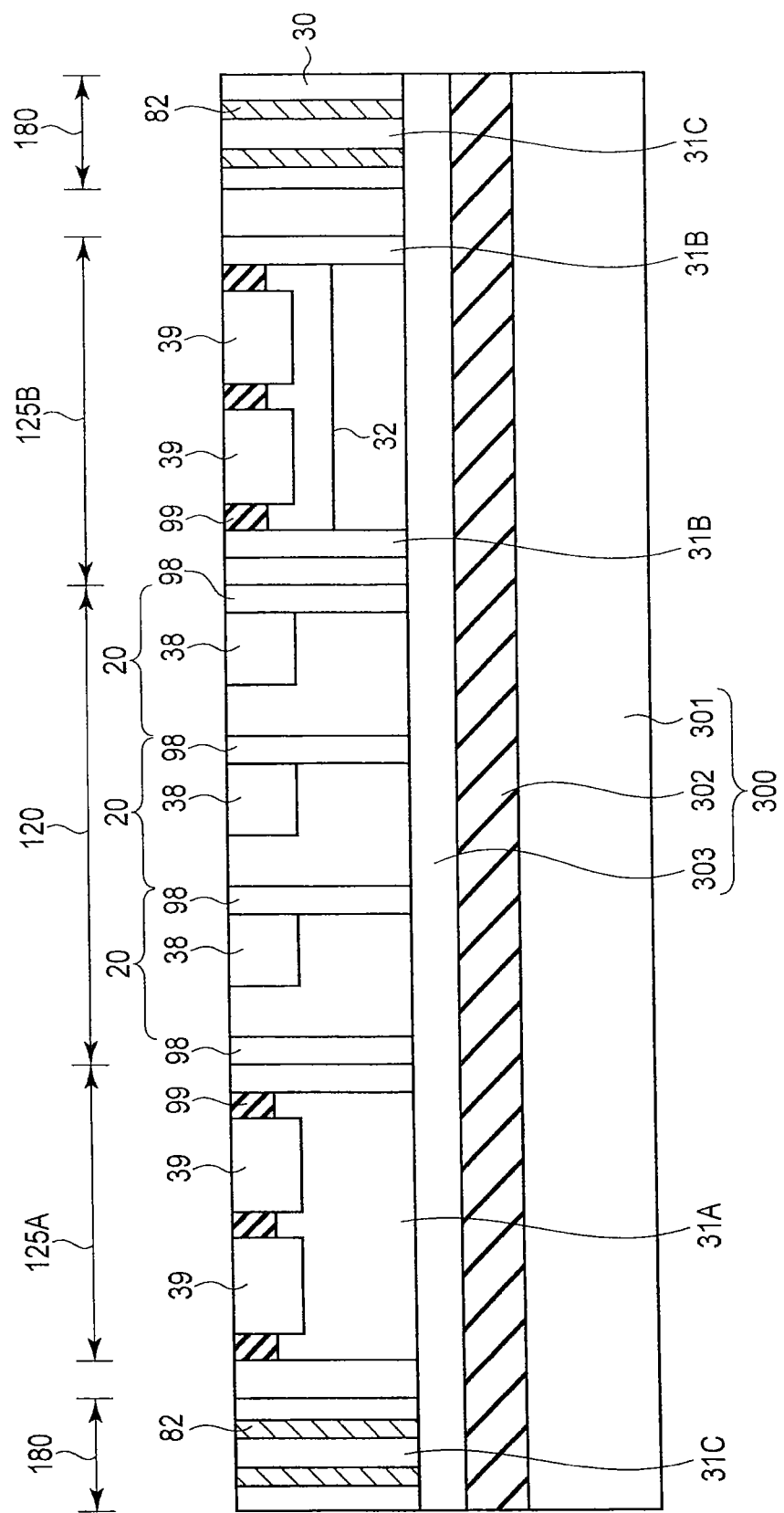

As illustrated in FIG. 8, trenches for isolating elements are formed in predetermined positions in the epitaxial layer 30 by the photolithography and reactive ion etching (RIE). In each trench for isolating elements, an insulator is buried by the CVD or applying thereof. With this, the element isolation insulators 99 of the STI structure are formed in the predetermined positions in the epitaxial layer 30. For example, the element isolation insulators 99 are formed in the boundary between N-type impurity regions (for example, N-type well regions) and P-type impurity regions (for example, P-type well regions) which will be formed in the peripheral circuit areas 125A and 125B, and in the pixel array 120.

In a process separate from the process for forming the element isolation insulators 99, impurity regions 31A, 31B, and 98 are formed one after another in the epitaxial layer 30 by ion implantation with a resist layer (not shown) used as a mask.

For example, P-type impurity semiconductor regions (P-type region) 31A and 98 are formed in predetermined positions in the N-type epitaxial layer 30 where elements and element isolation regions will be formed by the ion implantation with a resist layer with openings used as a mask. The P-type regions 31A are used as an element formation area 31A in the pixel array 120 and peripheral circuit areas 125A and 125B. The P-type regions 31B and 98 are used as impurity layers for isolating elements of the pixel array 120 and peripheral circuit areas 125A and 125B, or the element isolation impurity layer 98 in the pixel array 120.

For example, simultaneously with formation of the P-type regions 31A and 98 in the element formation area and element isolation region, P-type regions 31C are formed in the contact areas 180 of the image sensor. The contact areas 180 may be N-type impurity semiconductor regions (or, N-type regions).

The accelerating energy of ions to be implanted is, for example, about 100 keV-3 MeV. The maximum accelerating energy is, however, suitably adjusted in accordance with the performance, productivity, and process of an ion implanter. The accelerating energy of ions is preferably 3 MeV or less. The dose of boron to form the P-type regions 31A, 31B, and 98 is, for example, about $1 \times 10^{11}$-$1 \times 10^{13}$ cm$^{-2}$. The P-type regions 31A, 31B, and 98 have, for example, about $1 \times 10^{15}$-$1 \times 10^{17}$ cm$^{-3}$ in impurity concentration.

After formation of the P-type regions 31A, 31B, and 98 and removal of the mask for forming the same, another resist layer (not shown) with openings where element formation areas and element isolation regions will be formed on the epitaxial layer 30 is formed. The openings of the resist layer are formed where the N-type regions will be formed. With the resist layer with such openings used as a mask, the N-type regions 32 are formed in the peripheral circuit areas 125A and 125B by ion implantation.

Then, P or N-type well regions 39 are suitably formed in the P or N-type regions 31A and 32 where elements will be formed by ion implantation with a resist layer used as a mask.

In this process, for example simultaneously with the formation of the P-type well regions, the P-type regions (or, well regions) 38 are formed in areas 20, which are surrounded by the P-type isolation impurity layers 98, in the pixel array 120 in the epitaxial layer 30 by ion implantation with the resist layer used as the mask.

Thus, with the process illustrated in FIG. 8, the element isolation insulators 99 and element isolation impurity layers 98, which electrically separate adjacent elements, are formed in the semiconductor layer 30. They define the pixel array 120 and peripheral circuit areas 125A and 125B in the semiconductor layer 30 on the SOI substrate 300.

In areas in the pixel array 120 and peripheral circuit areas 125A and 125B where elements will be formed, P or N-type regions 31A, 32, 38, and 39 are formed. The cell formation areas 20 are formed in the pixel array 120.

The element isolation insulators 99 may be formed in the semiconductor layer 30 after the P or N-type regions 31A, 31B, 32, 38, 39, and 98 are formed.

Figure 9:
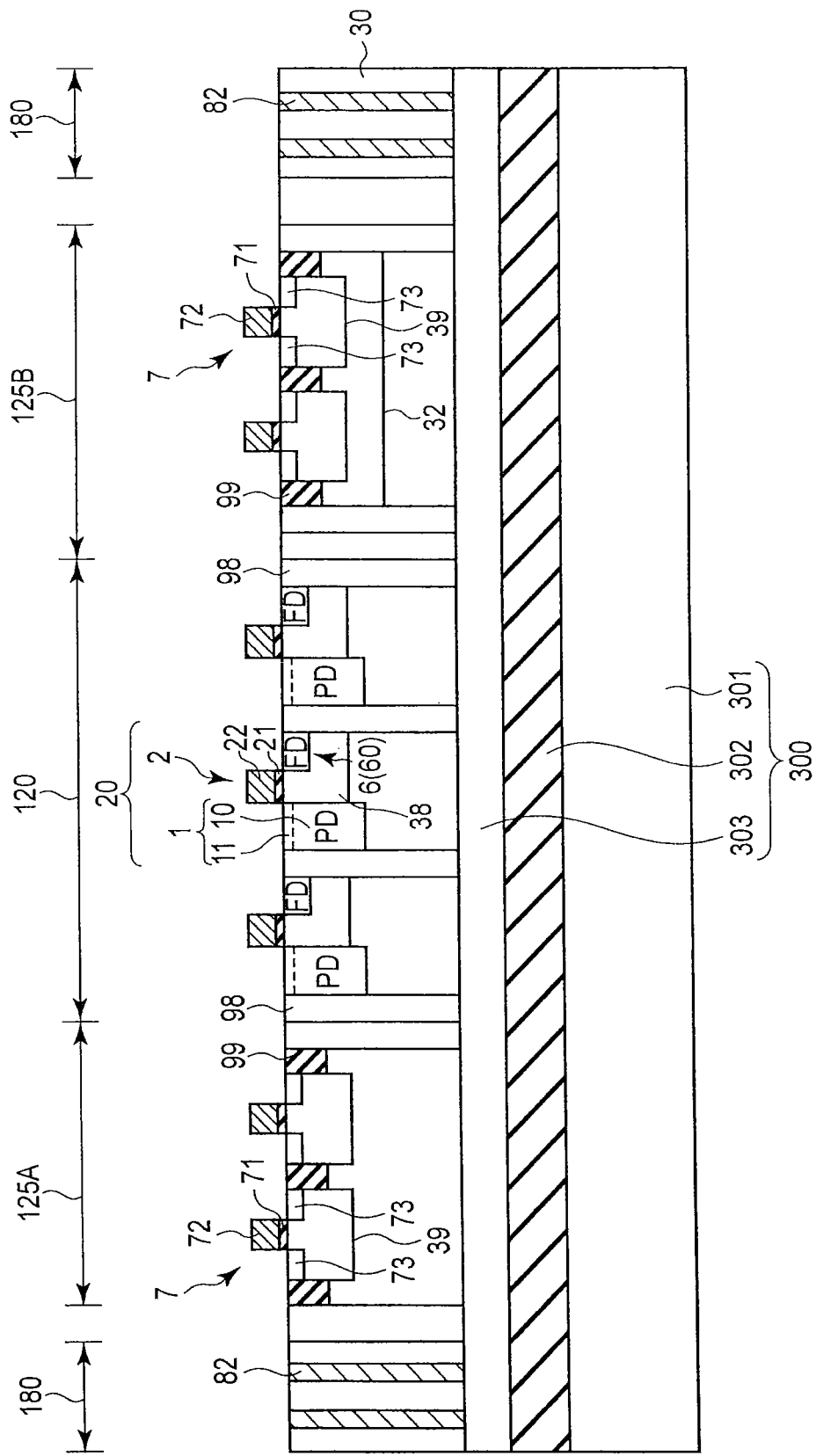

As illustrated in FIG. 9, elements to be included in the image sensor are formed in the cell formation areas 20 of the pixel array 120 and well regions 38 and 39 of the peripheral circuit areas 125A and 125B.

The gate insulators 21 and 71 of respective transistors 2 and 7 are formed on the exposed surface of the epitaxial layer 30 by, for example, thermal oxidation to the epitaxial layer 30. Polysilicon layers are accumulated on the formed gate insulators 21 and 71 by the CVD. Then, with a photolithography and the RIE, the polysilicon layer is processed to form the gate electrodes 22 and 72 with a predetermined gate length and width on the surface (or, first surface) of the epitaxial layer 30 with the gate insulators 21 and 71 therebetween.

In the pixel array 120, for example, the formed gate electrodes 22 and a resist layer (not shown) are used as a mask to form the N-type impurity layers (or, N-type regions) 10 of the photo diodes 1 in the cell formation areas 20 by the ion implantation. In the surface of the formed N-type impurity layers 10, the P-type impurity layers 11 as the surface shield layers are formed by the ion implantation. In the P-type regions 38 in the cell formation areas 20, the N-type impurity layers 60 as the floating diffusions and the N-type regions (not shown) as the source/drains of the transistors (for example, read transistor) 2 are formed.

The peripheral circuit areas 125A and 125B are covered with the resist layer (not shown) during the process in which the impurity layers included in the components 1, 2, and 6 of the unit cells are being formed in the pixel array 120, for example.

P or N-type impurity layers as the source/drains of the transistors 7 are formed in the epitaxial layer 30 in the areas (or, N or P-type well regions) 39 in the peripheral circuit areas 125A and 125B, in which the transistors 7 will be formed, by the ion implantation with the gate electrodes 72 used as a mask.

Thus, with the process illustrated in FIG. 9, the photo diodes 1 forming the unit cells 20, floating diffusions 6, field-effect transistors 2, and field-effect transistors 7 forming the peripheral circuit are formed in the pixel array 120 and the peripheral circuit areas 125A and 125B.

The transistors 2 in the unit cells 20 and transistors 7 of the peripheral circuit may be formed in the same process or separate processes. The transistors 2 and 7 may be formed after formation of the photo diodes 1.

Figure 10:
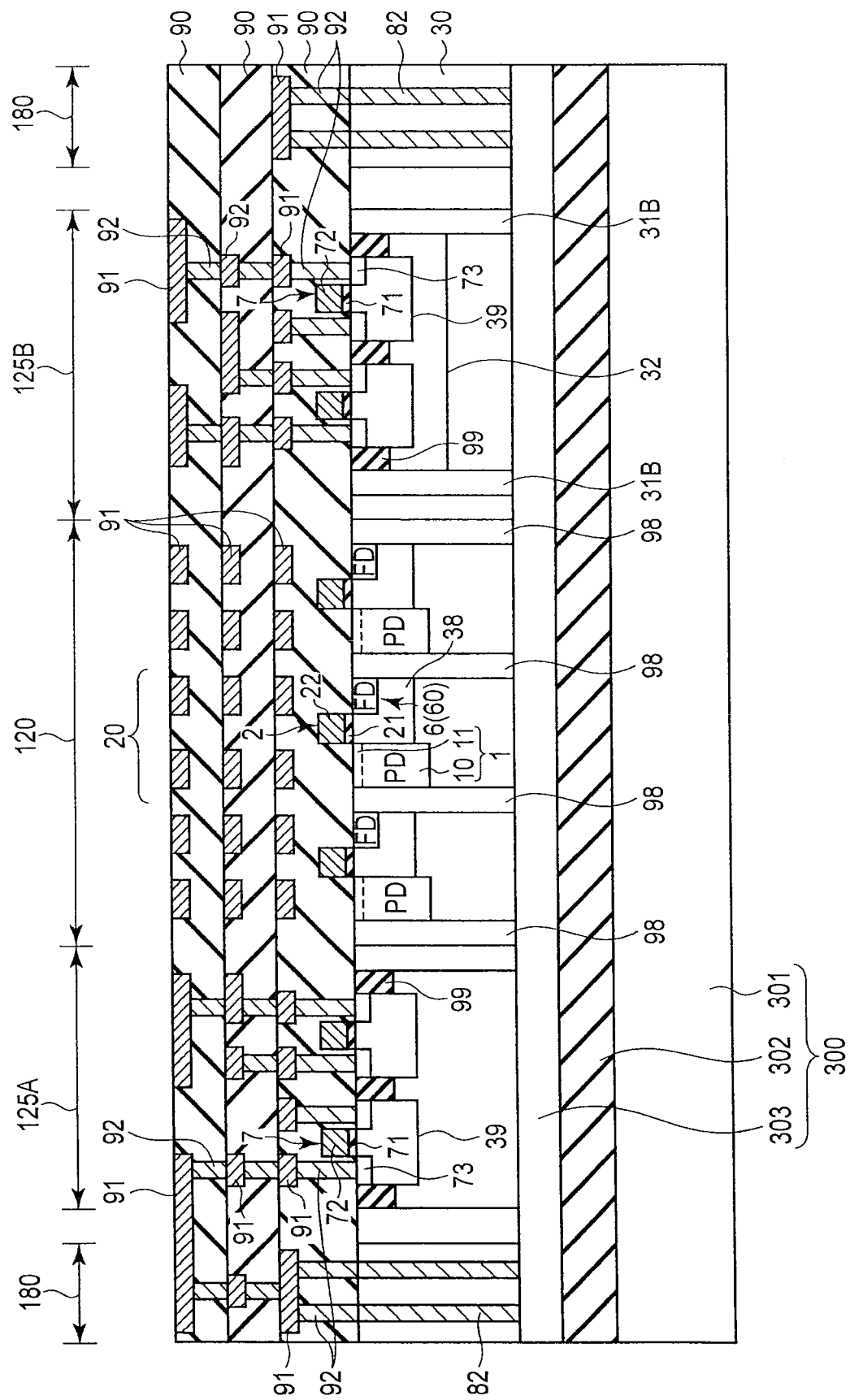

As illustrated in FIG. 10, the lowest interlayer dielectric (of, for example, silicon oxide) 90 is deposited on the surface of the epitaxial layer 30 on which the elements 1, 2, and 7 have been formed by, for example, the multilayer interconnection process (or, multilayer interconnection technique) with the CVD. The interlayer dielectric 90 covers the surface of the epitaxial layer 30, as well as, for example, the gate electrodes 22 and 72 of the transistors 2 and 7.

After the upper surface of the interlayer dielectric 90 is planarized by the CMP, contact holes are formed in the interlayer dielectric 90 by the photolithography and RIE. The contact plugs (of, for example, tungsten or molybdenum) 92 are buried in the formed contact holes.

For example, a conductive layer, such as aluminum and copper, is deposited on the interlayer dielectric 90 and contact plugs 92 by sputtering.

The deposited conductive layer is processed into a predetermined form to be coupled to the contact plugs 92 by the photolithography and RIE, etc. Thus, the conductive layers 91 as interconnects are formed. Simultaneously with the formation of and with the same material as the conductive layers 91 as interconnects, shade layers and dummy layers are formed on the interlayer dielectric 90. For a case of the interconnects (of copper) 91 being formed by the damascene process, trenches (or, damascene trenches) are formed in an interlayer dielectric 90 at a particular interconnect level, followed by deposition of copper on that interlayer dielectric 90. Then, the CMP performed on the deposited copper results in copper interconnects buried in the damascene trenches in the interlayer dielectric 90 in a self-alignment manner. Thus, the multilayer interconnects of a damascene structure are formed.

In the interlayer dielectric 90 covering the surface of the contact areas 180, the plugs 92 and interconnects 91 are formed to be coupled to the conductive materials 82 as the through electrodes simultaneously with the formation of the plugs 92 and interconnects 91 to be coupled to elements at the front surface side of the epitaxial layer 30.

By substantially the same process as the formation of the interconnect layers at the lowest interconnect level, a further interlayer dielectric 90, plugs (or, via plugs) 92, and conductive layers (for example, interconnects or shade layers, or dummy layers) 91 are formed in each interconnect level one after another by the multilayer interconnection process. The pads at the front surface side of the image sensor may be formed from, for example, the conductive layers 91 at the top interconnect level.

Thus, at the front surface FS side of the semiconductor substrate 30, the interconnects 91 and interlayer dielectrics 90 of a multilayer interconnection structure are formed on the front surface FS of the semiconductor substrate to cover the elements 2 and 7 at the front surface FS side of the semiconductor substrate 30.

With this, multiple elements 1, 2, and 7 on the epitaxial layer 30 as the semiconductor substrate are coupled by the interconnects of the multilayer interconnection technique to form the circuits of the image sensor. Moreover, the conductive materials (or, through electrodes) buried in the epitaxial layer 30 in the contact areas 180 are coupled to the conductive layers 91 and plugs 92 in the interlayer dielectrics 90.

Figure 11:
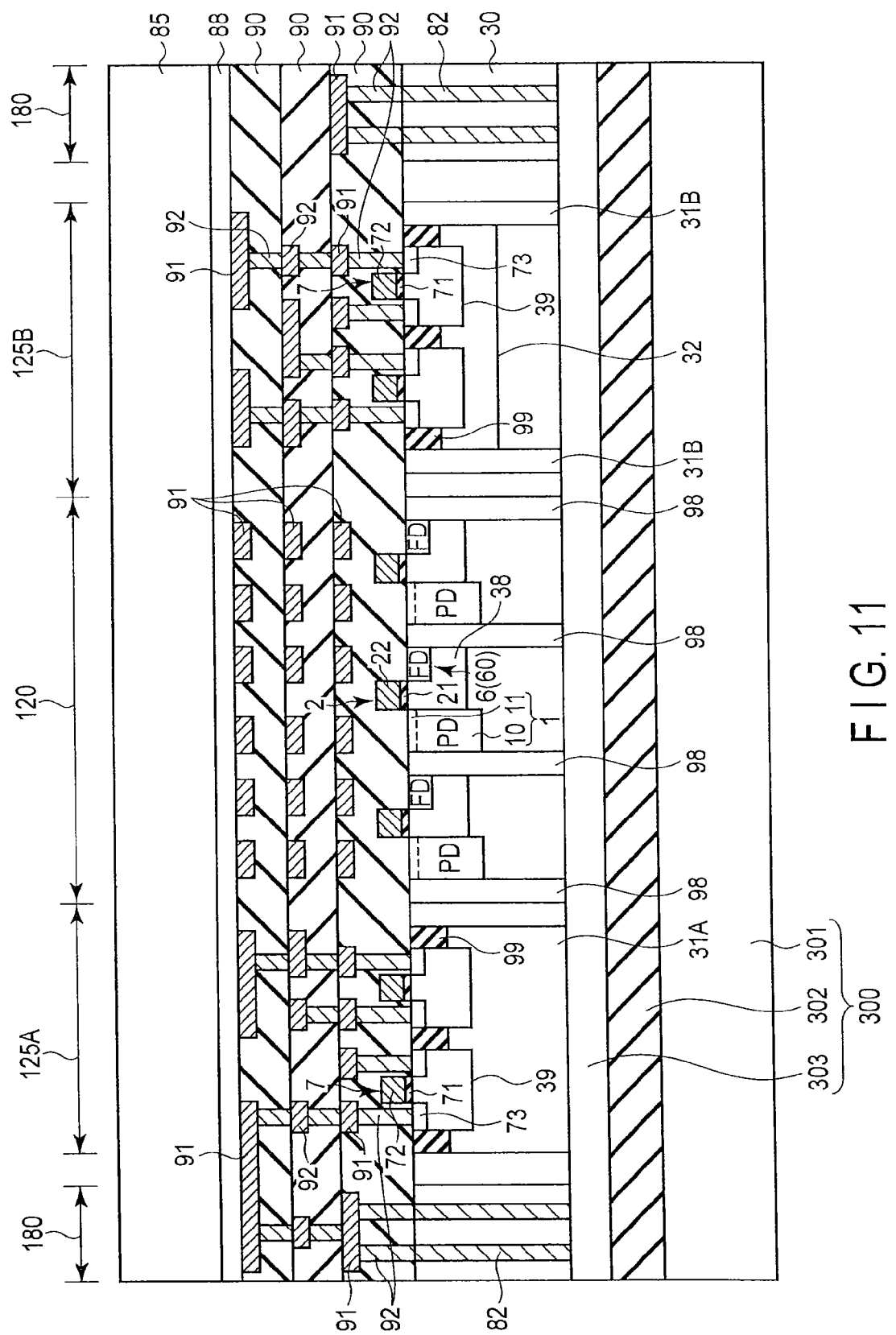

As illustrated in FIG. 11, the top surfaces of the top interlayer dielectric 90 and conductive layer 91 at the front surface side of the epitaxial layer 30 are planarized by, for example, the CMP, then an adhesive layer (of, for example, silicon oxide) 88 is formed on the top interlayer dielectric 90 and conductive layers (for example, interconnects and the front surface side pads) 91. Then, the support substrate 85 is formed on the adhesive layer 88. An adhesive layer (not shown) formed on the support substrate 85 is bonded on the adhesive layer 88 on the interlayer dielectric 90, for example. With this, the support substrate 85 bonds to the interlayer dielectric 90 over the epitaxial layer 30.

The re-distribution layers by the re-distribution technique may be formed on the top interlayer dielectric 90 to be couple to the interconnects in the interlayer dielectric 90, for example, before bonding of the support substrate 85 on the interlayer dielectric 90.

Figure 12:
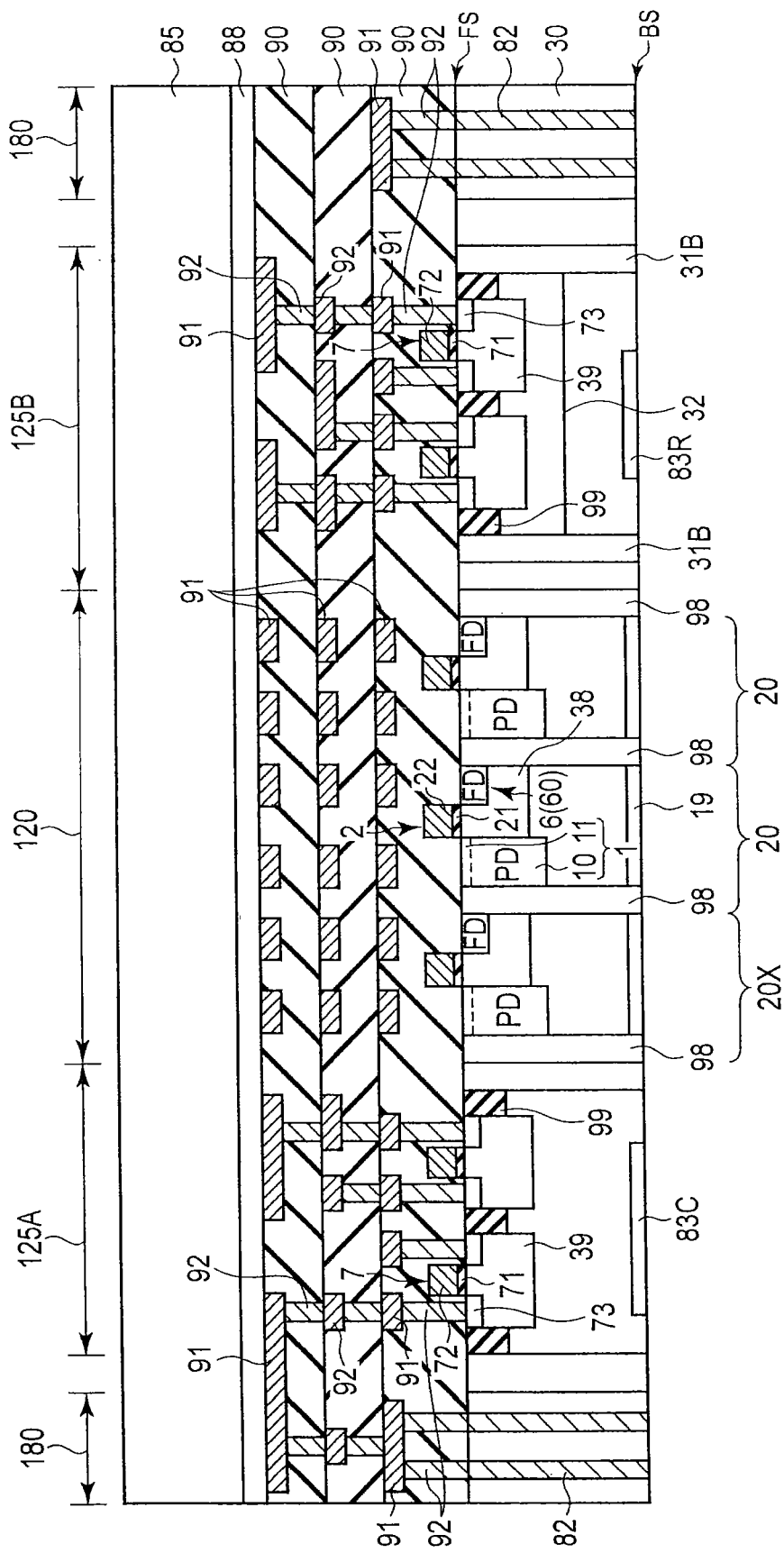

As illustrated in FIG. 12, after bonding of the support substrate 85 on the interlayer dielectric 90, the semiconductor substrate, BOX layer, and SOI layer in the SOI substrate are selectively removed by the CMP or wet etching with HF solution, etc. With this, the conductive materials 82 at and in the back surface of the epitaxial layer 30 are exposed.

The P-type impurity layers 19 as shield layers are formed in the epitaxial layer (or, N-type region) 30 of the cell formation areas 20 at the back surface BS side of the exposed epitaxial layer 30 by the ion implantation.

The SOI layer (or, silicon layer) may not be removed to be used for components of the image sensor. In this case, through electrodes are formed in the SOI layer in the process illustrated in FIGS. 6 and 7, and the back surface shield layers 19 are formed in the SOI layer in the process illustrated in FIG. 12.

In the present embodiment, as illustrated in FIG. 12, the diffusion layers 83C and 83R as components of the back surface side passive elements (i.e., capacitance elements and resistance elements) are formed in predetermined positions in the semiconductor regions 31A and 31Bs of the peripheral circuit areas 125A and 125B at the back surface side of the epitaxial layer 30 by, for example, the ion implantation with a resist mask (not shown) on the back surface BS of the epitaxial layer 30. The diffusion layers 83C and 83R included in the back surface side passive elements are each used for an electrode (for example, a capacitor electrode) 83C of an element, for a resistive body 83R of an element, or for a terminal of an element.

The impurity concentrations of the diffusion layers 83C and 83R are suitably adjusted in accordance with the properties of the capacitance element CE and resistance element RE as passive elements. For example, for a case of semiconductor regions 31A and 31B with the diffusion layers 83C and 83R formed therein being N-type regions, P-type diffusion layers 83C and 83R are formed in the N-type regions. For a case of semiconductor regions 31A and 31B with the diffusion layers 83C and 83R formed therein being P-type regions, N-type diffusion layers 83C and 83R are formed in the P-type regions.

Figure 13:
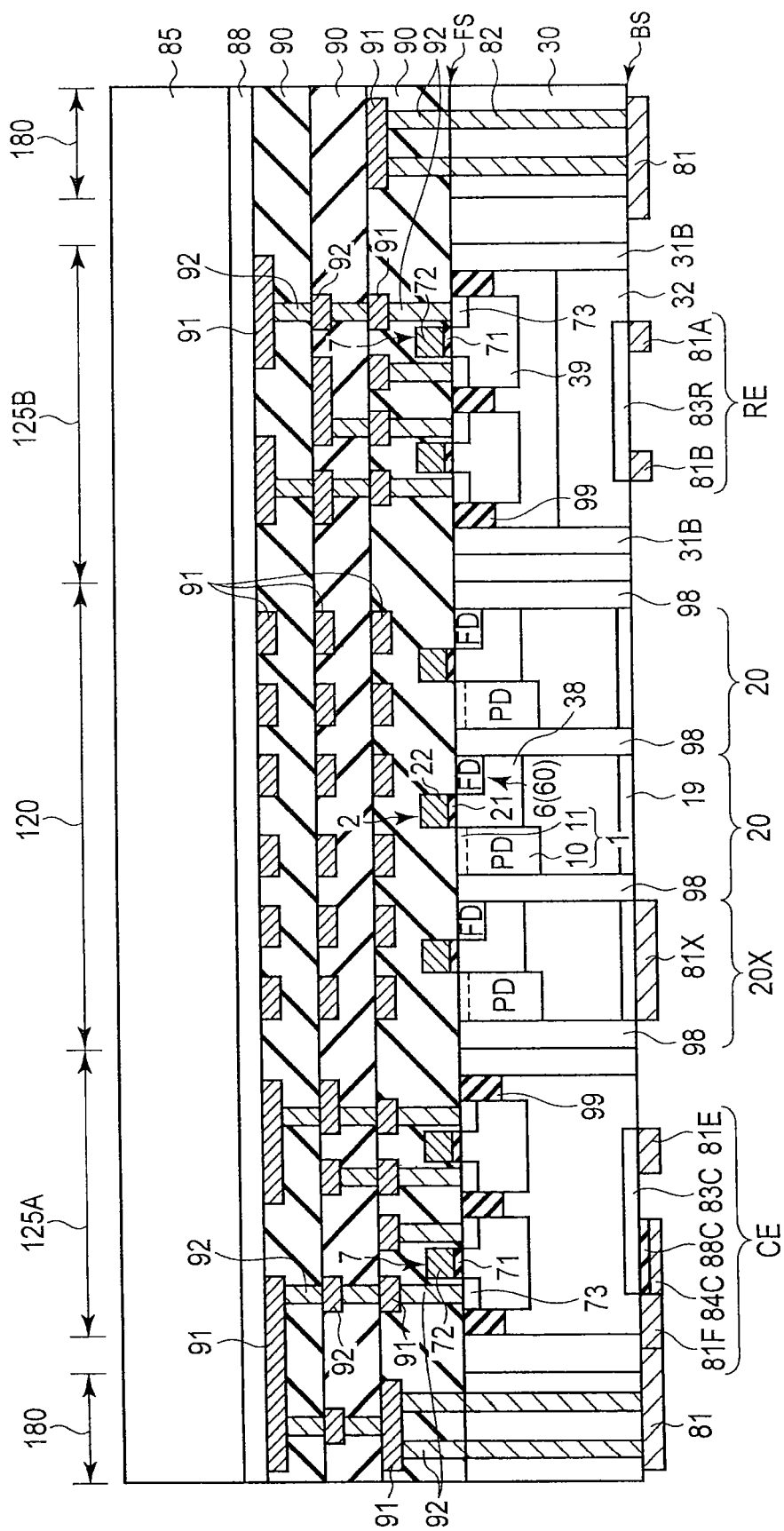

As illustrated in FIG. 13, an insulator (or, a dielectric or capacitor insulator) as a component of a capacitance element is formed on the diffusion layer 83C as the electrode (or, capacitor electrode) of the capacitance element where the capacitance element CE will be formed by the CVD or thermal oxidation. The capacitor insulator 88C is formed to be in contact with the diffusion layer 83C as the capacitor electrode.

For example, after a protective film (not shown) is formed on the back surface of the epitaxial layer 30, a metal layer is deposited on the back surface of the epitaxial layer 30 by sputtering. The deposited metal layer is processed into a predetermined form by the photolithography and RIE. Where the metal layer is to be in direct contact with the through electrodes 82 and semiconductor regions 31A and 31B, the protective film is removed before the deposition of the metal layer.

With this, the shade layers (or, metal layers) 81X are formed in the back surface side of some of the cell formation areas 20 and 20X in the pixel array 120. The covering of the cell formation areas 20X with the shade layers 81X results in formation of the OB areas 129 and valid areas in the pixel array 120.

Simultaneously with the formation of the shade layers 81X, the metal pads (or, back surface side pads) 81 are formed, at the back surface side of the contact areas 180, to be coupled to the conductive materials (or, through electrodes) 82 in the epitaxial layer 30. Moreover, simultaneously with the formation of the shade layers 81X, the metal interconnects (or, back surface side interconnects) are formed on the back surface BS of the epitaxial layer 30.

In the manufacturing method of the image sensor of the present embodiment, the metal layers 81A, 81B, and 84C as components of the back surface side passive elements CE and RE are formed at the back surface side of the epitaxial layer 30 substantially simultaneously with the formation of the shade layers 81X and pads 81. The metal layers 81A, 81B, and 84C as the components of the back surface side passive elements CE and RE are patterned into predetermined forms to be a capacitor electrode of a capacitance element, a resistive body of a resistance element, or a terminal of an element. The metal layer 84C as a capacitor electrode is formed on the capacitor insulator 88C. The metal layers 81A and 81B as terminals of the elements CE and RE are formed on the diffusion layers 83C and 83R to be in direct contact with the diffusion layers 83C and 83R.

The metal layers 81A, 81B, and 84C of the back surface side passive elements CE and RE are formed in the peripheral circuit area 125 at the back surface side of the epitaxial layer 30, for example.

Thus, the passive elements, such as capacitance element CE and resistance element RE, are formed at the back surface side of the semiconductor substrate 30 for the image sensor.

For a case of the metal layers 81A, 81B, and 84C as the terminals and electrodes of elements being formed from the same material as the back surface side interconnects (or, the back surface side pads) 81F, the metal layers 81A, 81B, and 84C are continuous therewith. The back surface side passive elements CE and RE are coupled to the back surface side pads 81 or through electrodes 82 via the back surface side interconnects 81F. With this, the back surface side passive elements CE and RE are coupled to the elements and circuits at the front surface side of the epitaxial layer (or, semiconductor substrate) 30.

After the shade layers 81X, back surface side pads 81, and back surface side elements (for example, resistance element and capacitance element) are formed at the back surface side of the epitaxial layer (or, substrate), a planarization layer 89 is formed on the back surface of the epitaxial layer 30 to cover the shade layers 81X, back surface side pads 81, and back surface side passive elements CE and RE as illustrated in FIG. 4. The planarization layer 89 is formed with, for example, a stack of films, such as films of an acrylic resin and silicon oxide.

A color filter layer CF with a predetermined filter (or, pigment film) arrangement pattern is formed on the planarization layer 89 at the back surface side where it vertically overlaps with the pixel array 120 with respect to a direction perpendicular to the main surfaces of the epitaxial layer 30. The microlens array ML is formed at the back surface side of the epitaxial layer 30 where the microlens array ML vertically overlaps with the pixel array 120 with the color filter layer CF therebetween.

A single filter and a single micro lens are arranged for a single photo diode in the pixel array 120 at the back surface side of the epitaxial layer 30. The filter layers CFX with stacked multiple filters therein may be formed for unit cells of the OB areas 129 for improving light blockage.

Openings are formed in the planarization layer 89 to expose the back surface side pads 81, and then the chip of the back-illuminated image sensor 100 is mounted on lead frames or a package substrate such as a BGA. For a case of the front surface side pads being provided in the image sensor, openings are formed in the support substrate 85 to expose the surface side pads.

The back surface side pads 81 and surface side pads of the image sensor 100 are electrically coupled to interconnects and terminals of the package substrate by bonding wires or solder balls (or, solder bumps). With this, the image sensor 100 is made as a package.

As illustrated in FIG. 2, the lens holder 117 and shield unit 119 are attached to the image sensor 100, and are mounted on the circuit board (or, printed circuit board) 200. The package of the memory or controller is mounted on the circuit board 200. Thus, the camera module with the back-illuminated image sensor therein is formed.

With the process described above, the image sensor 100 of the present embodiment and the camera module with the image sensor therein are formed.

In the method of manufacturing the image sensor of the present embodiment, a case of the image sensor being formed with the SOI substrate 300 is illustrated; however the image sensor may be formed with a bulk substrate (for example, a silicon single crystal substrate). When a bulk substrate is used, a time for which etching for forming trenches (or, through holes) is adjusted in order to form the trenches of desired depths, for example. Then, after bonding of the support substrate, the back surface of the bulk substrate is ground until the trenches are reached to form the through holes reaching from the front surface of the bulk substrate to the back surface.

In the method of manufacturing the image sensor of the present embodiment, described is a case of the formation of the through electrodes in the semiconductor substrate before formation of the unit cells (or, pixels) and interlayer dielectrics of the image sensor. However, in the method of manufacturing the image sensor of the present embodiment, the through electrodes may be formed in the semiconductor substrate after the unit cells (or, pixel) and interlayer dielectrics of the image sensor are formed.

As illustrated in FIGS. 6 to 13, in the method of manufacturing the image sensor of the present embodiment, the passive elements (or, back surface side passive elements) CE and RE, such as capacitance elements and resistance elements for the image sensor 100 are formed at the back surface side of the semiconductor substrate from which light from an object is received. In the present embodiment, the back surface side passive elements CE and RE are formed at the back surface side of the semiconductor substrate 30 to vertically overlap the elements 7 provided at the front surface side of semiconductor substrate 30 with respect to a direction perpendicular to the main surfaces of the semiconductor substrate 30. With this, according to the manufacturing method of the image sensor of the present embodiment, the image sensor 100 with a reduced chip size can be provided.

Since the camera module with the image sensor 100 formed by the manufacturing method of the present embodiment therein has components of the camera module formed at the back surface side of the image sensor 100, an area on the circuit board (or, printed circuit board) 200 where the passive elements are arranged can be reduced. As a result, the camera module with a reduced size can be provided according to the present embodiment.

In the method of manufacturing the image sensor of the present embodiment, the metal layers 81A, 81B, and 84C included in the back surface side passive elements CE and RE are formed with substantially the same material as and substantially a common process as the back surface side pads 81 and the back surface side interconnects. Therefore, even if the passive elements CE and RE are formed at the back surface side of the semiconductor substrate 30 as in the image sensor of the present embodiment, the manufacturing process of the image sensor hardly increases in steps or becomes complicated. Therefore, the manufacturing method of the image sensor of the present embodiment can suppress an increase in the cost for manufacturing the image sensor resulting from forming elements at the back surface side of the semiconductor substrate, and therefore reduce the chip size to reduce the cost for the chip of the image sensor.

As described above, according to the method of manufacturing the solid state imaging device of the present embodiment, the solid state imaging device (or, image sensor or camera module) with a reduced size can be provided.

(3) Examples

Referring to FIGS. 14A and 14B to FIG. 20, examples of the image sensor of the present embodiment will be described.

Figure 14A:
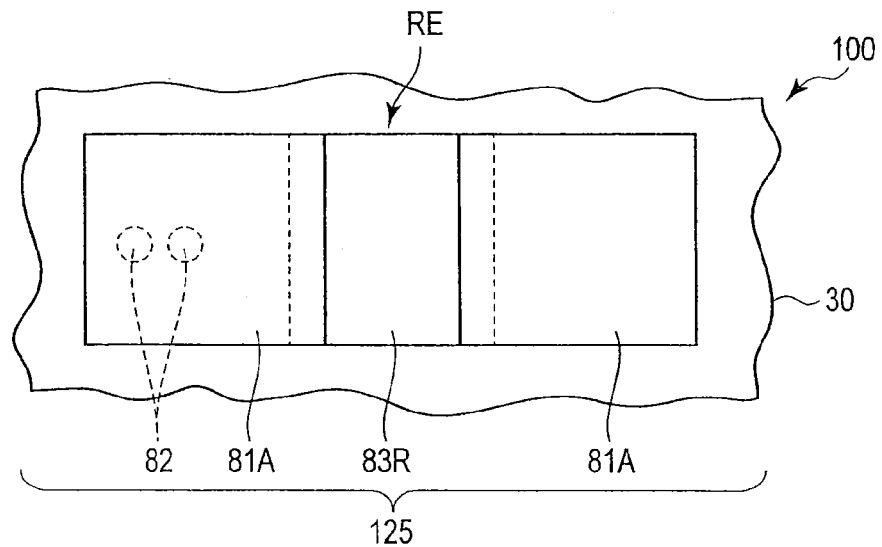
FIGS. 14A and 14B schematically illustrate a specific example of a solid state imaging device of the embodiment.
Figure 14B:
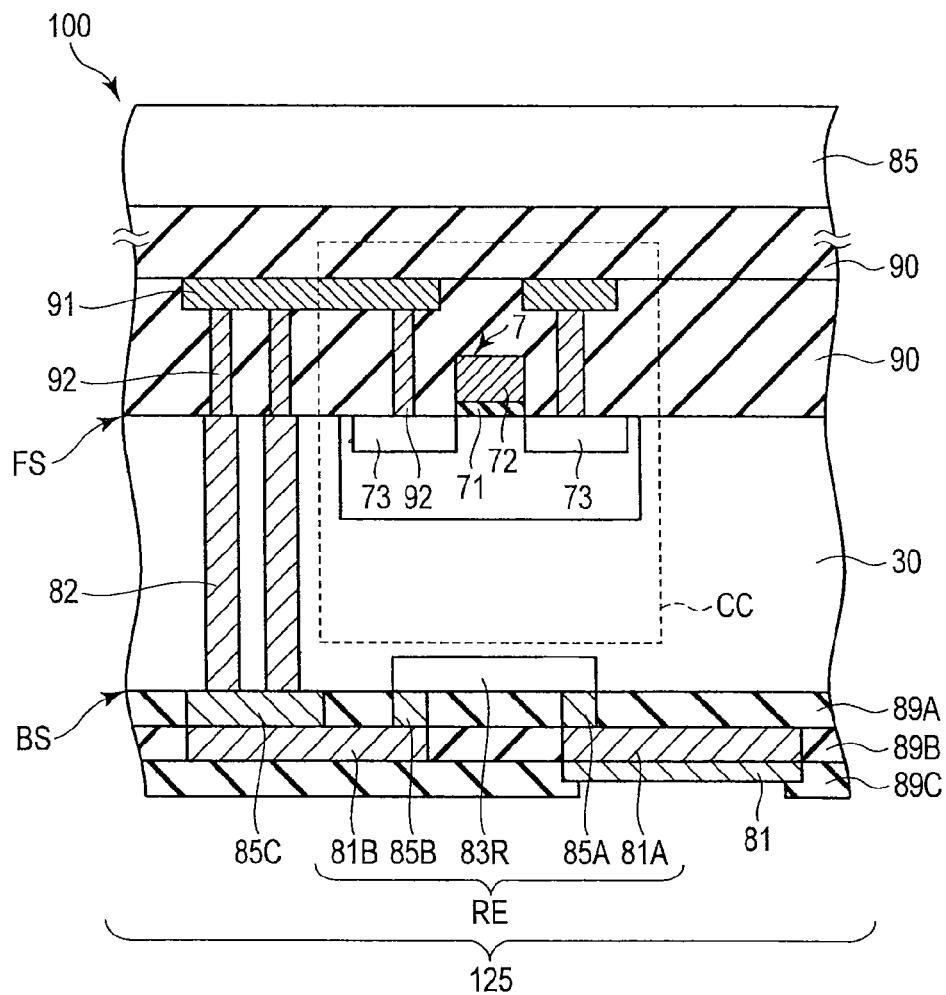
Figure 19A:
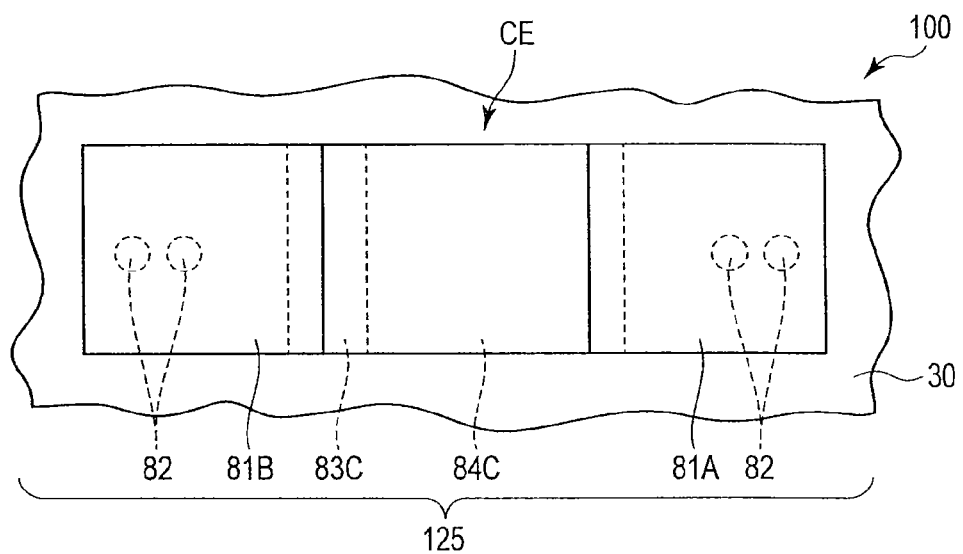
FIGS. 19A and 19B schematically illustrate a specific example of a solid state imaging device of the embodiment.
Figure 19B:
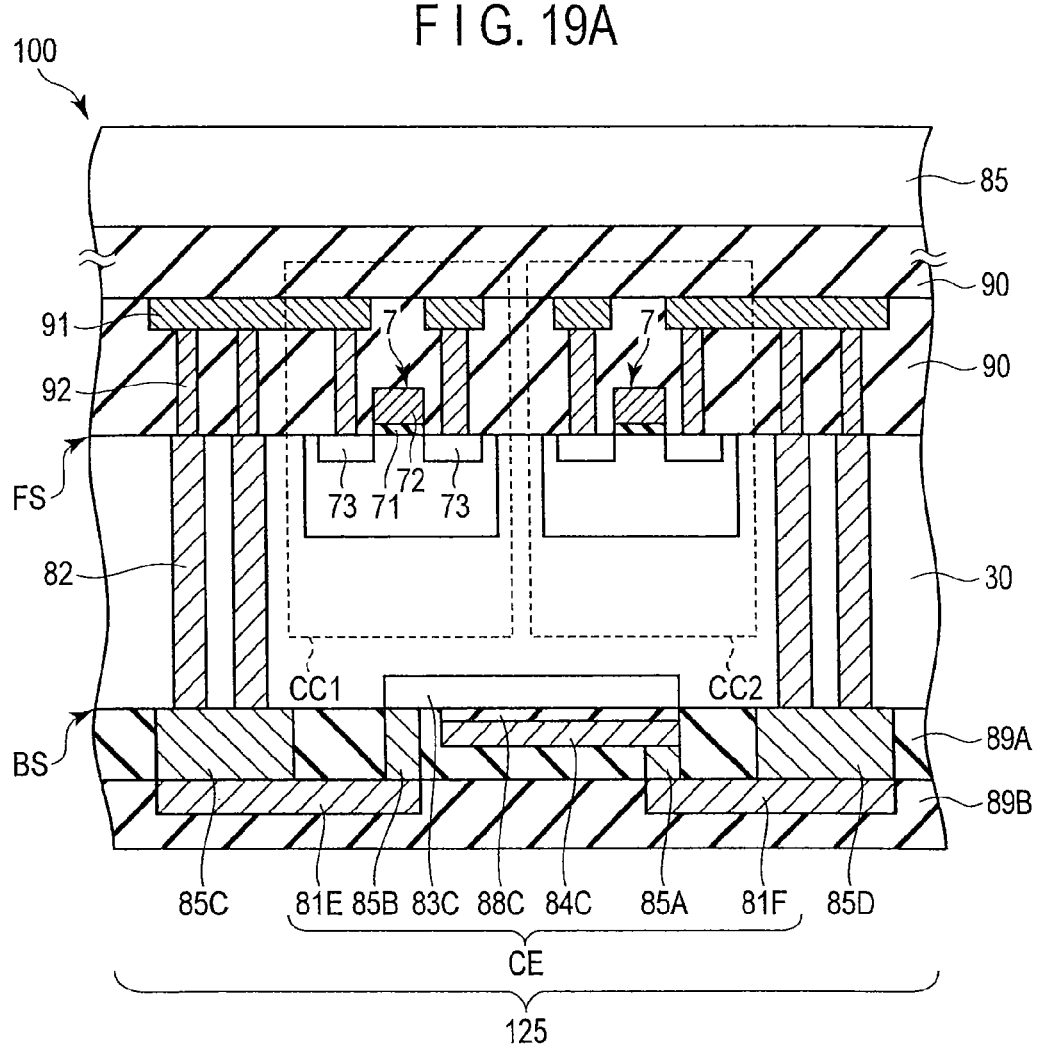
Figure 20:
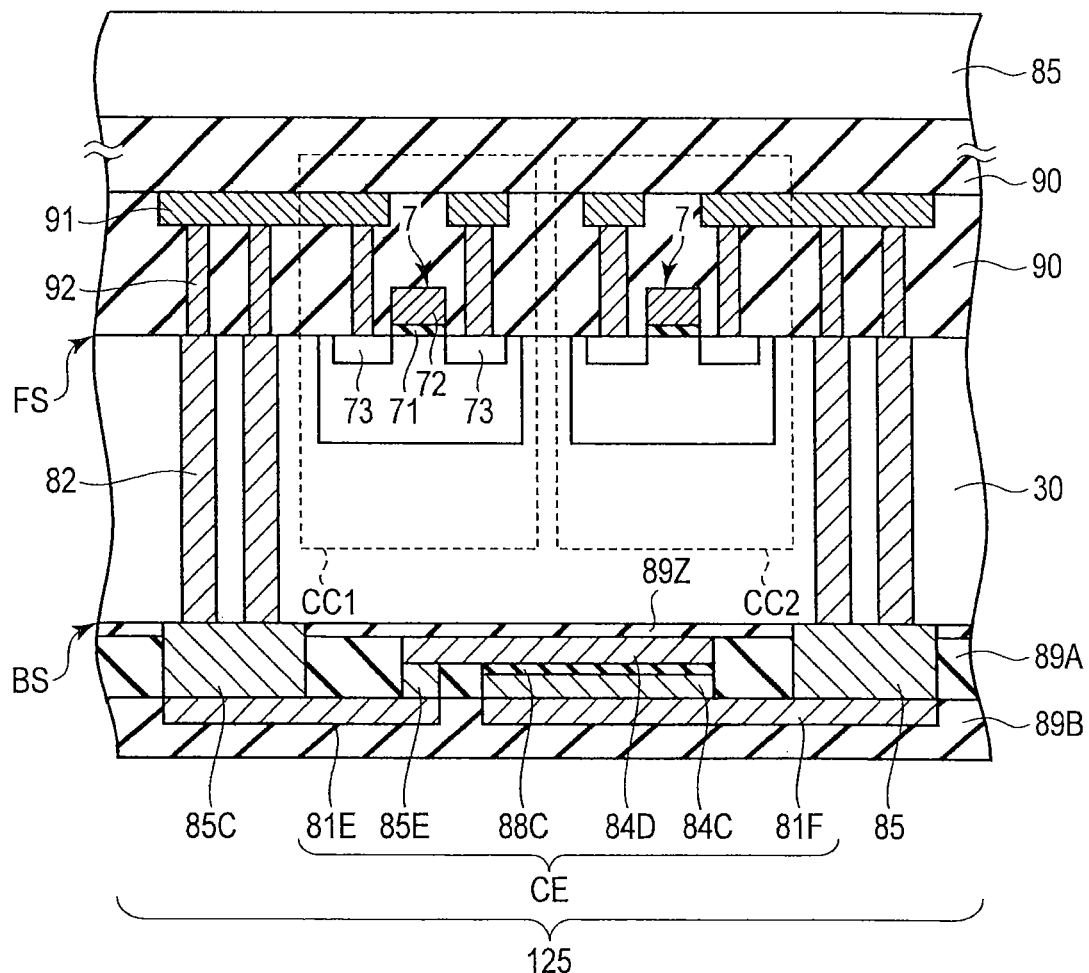
FIG. 20 schematically illustrates a specific example of the solid state imaging device of the embodiment.

FIGS. 14A and 14B or FIG. 20 are sectional views showing specific structure examples of the back surface side elements included in the image sensor of the present embodiment. FIGS. 14A and 14B to FIG. 20 only illustrate the peripheral circuit area 125 in which the back surface side devices RE and CE are provided in the image sensor of the present embodiment.

FIGS. 14A and 14B to FIGS. 17A and 17B illustrate some specific structure examples of the resistance element at the back surface side of the semiconductor substrate in the image sensor of the present embodiment.

FIG. 14A illustrates a plane view of the resistance element as the back surface side passive element, and FIG. 14B a cross-sectional view of the resistance element of FIG. 14A.

As illustrated in FIGS. 14A and 14B, the resistance element RE as the back surface side passive element is a diffusion layer resistance with the diffusion layer 83R used as a resistive body. The diffusion layer 83R as the resistive body is provided at the back surface side of the semiconductor substrate 30 in the semiconductor region (or, semiconductor substrate 30). In order to form the resistance element RE of a predetermined resistance, the diffusion layer 83R as the resistive body has a predetermined impurity concentration, a length and a depth. The conductivity type of the diffusion layer 83R as the resistive body is suitably determined according to the property of the resistance element RE, and the conductivity type of the semiconductor region in which the diffusion layer 83R is provided.

Plugs 85A and 85B are coupled to both ends of the diffusion layer 83R. The plug 85A is provided in an insulator (or, a protective film or a planarization layer) 89A on the back surface of the semiconductor substrate 30.

One end of the diffusion layer 83R is coupled to a metal layer 81A via a plug 85A. The metal layer 81A is led out from one end of the diffusion layer 83R toward the back surface side pad 81 side, and coupled to the back surface side pad 81 of the image sensor 100. The back surface side pad 81 is provided on the metal layer 81A, and in direct contact with the metal layer 81A. The materials of the metal layers 81A and 81B may be the same as or different from that of the back surface side pad 81.

With this, the diffusion layer 83R as the resistive body is coupled to elements (not shown) outside the image sensor 100 via the back surface side pad 81.

The other end of the diffusion layer 83R is coupled to the metal layer 81B via a plug 85B.

The metal layer 81B is led out from the other end of the diffusion layer 83R toward the through electrodes 82.

The metal layer 81B is coupled to the through electrodes 82 in the semiconductor substrate 30 via a plug 85C. The through electrodes 82 are coupled to the transistor 7 of a peripheral circuit CC of the image sensor 100 via contact plugs 92 at the front surface FS side of the semiconductor substrate 30 and the interconnect (or, front surface side interconnect) 91 in the interlayer dielectric 90.

With this, the diffusion layer 83R as the resistive body is coupled to the element 7 at the front surface FS side of the semiconductor substrate 30 via the through electrodes 82 and front surface side interconnect 91.

The plugs 85A and 85B and metal layers 81A and 81B coupled to the diffusion layer 83R as the resistive body serve as terminals of the back surface side resistance element RE. The metal layers 81A and 81B as the terminals of the back surface side resistance element RE are also used as the back surface side interconnects 81A and 81B.

As illustrated in FIGS. 14A and 14B, the resistance element RE provided by the diffusion layer 83R is coupled between the back surface side pad 81 at the back surface BS side of the image sensor 100 and the peripheral circuit CC at the front surface FS side of the image sensor 100.

Figure 15A:
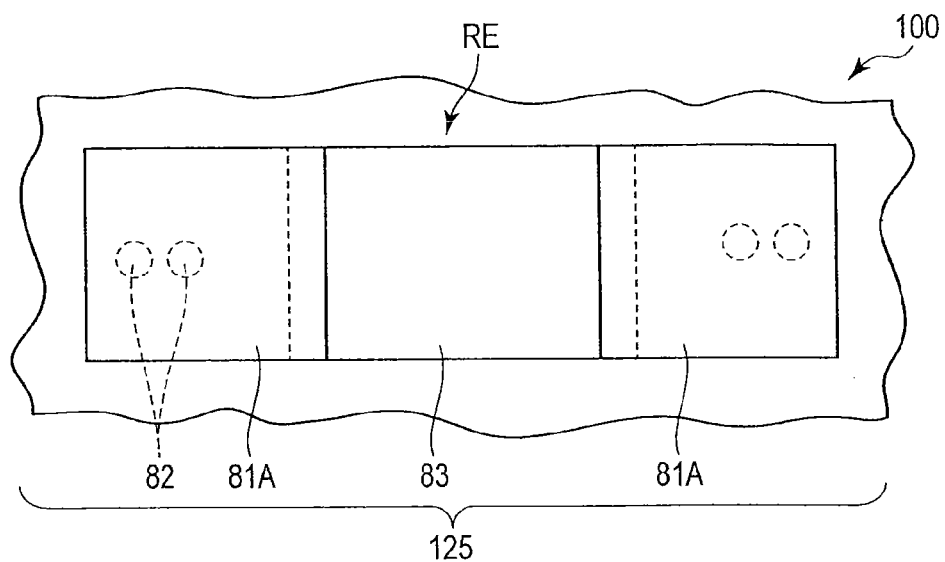
FIGS. 15A and 15B schematically illustrate a specific example of a solid state imaging device of the embodiment.
Figure 15B:
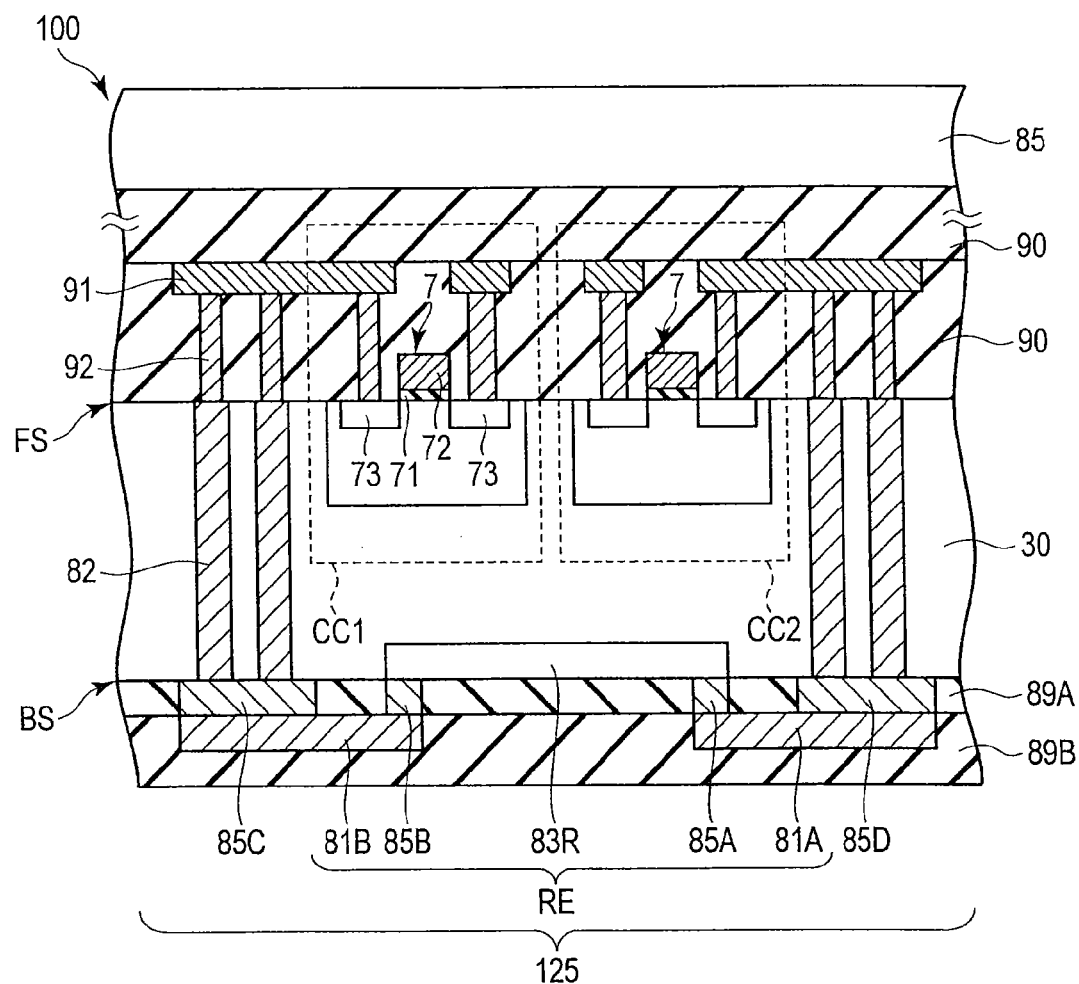

FIG. 15A illustrates a plane view of a resistance element as the back surface side passive element, and FIG. 15B a cross-sectional view of the resistance element of FIG. 15A.

As illustrated in FIGS. 15A and 15B, the resistance element RE by the diffusion layer 83R may be coupled to two peripheral circuits CC1 and CC2 at the front surface FS side of the semiconductor substrate 30. One end 81B of the resistance element RE is coupled to a transistor 7 of the peripheral circuit CC1 via the through electrodes 82. The other end 81A of the resistance element RE is coupled to another transistor 7 of the peripheral circuit CC2 via the through electrodes 82.

Thus, the back surface side resistance element RE included in the image sensor of the present embodiment is coupled to two peripheral circuits CC1 and CC2 at the front surface FS side of the semiconductor substrate 30.

A single resistance element RE may be coupled to three or more circuits at the front surface FS side of the semiconductor substrate.

FIGS. 16A and 16B and FIGS. 17A and 17B illustrate cross-sectional views of a back surface side resistance element RE with a configuration different from those of FIGS. 14A and 14B and FIGS. 15A and 15B.

Figure 16A:
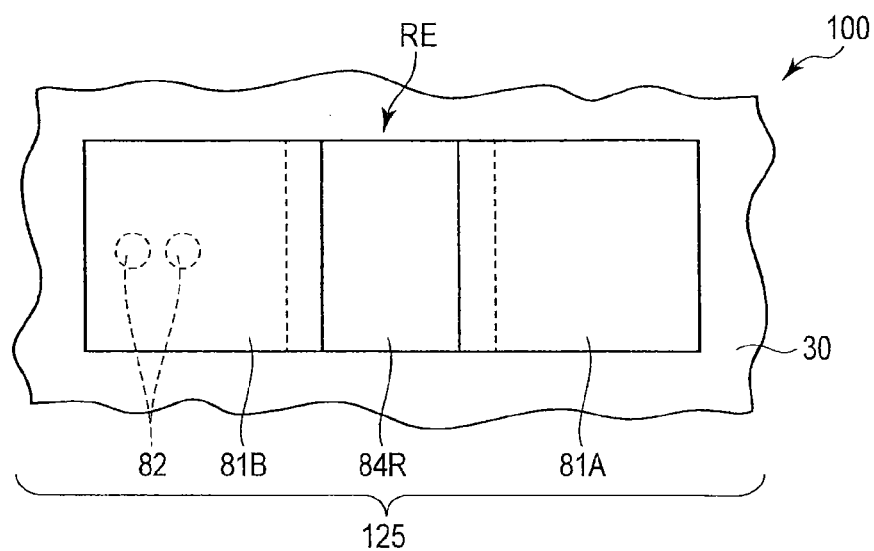
FIGS. 16A and 16B schematically illustrate a specific example of a solid state imaging device of the embodiment.
Figure 16B:
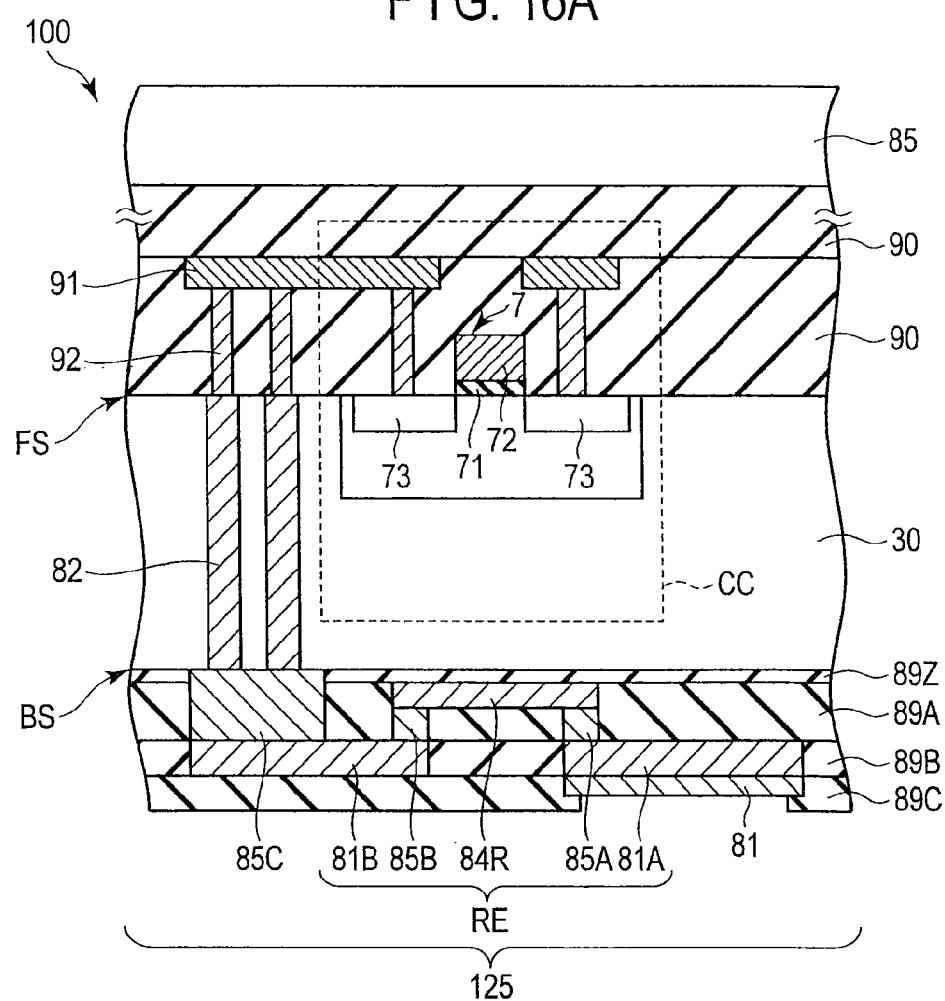

FIG. 16A illustrates a plane view of a resistance element as the back surface side passive element, and FIG. 16B a cross-sectional view of the resistance element of FIG. 16A.

As illustrated in FIGS. 16A and 16B, the resistive body of the resistance element RE may be formed with a metal layer 84R at the back surface BS side of the semiconductor substrate 30. For example, the metal layer 84R as the resistive body is formed with the same material as the shade layers or interconnects at the back surface side.

For example, the metal layer 84R as the resistive body is provided on an insulator (or, a protective film or a planarization layer) 89Z on the back surface of the semiconductor substrate 30. The metal layer 84R is electrically isolated from the semiconductor substrate 30 by the insulator 89Z.

In FIGS. 16A and 16B, the metal layer 84R as the resistive body of the back surface side resistance element RE has a rectangular plane shape; the metal layer 84R may have a folded plane shape (a zigzag or meandering shape) to adjust a length of the metal layer 84R as the resistive body in order to form a resistance element RE of a predetermined resistance in an area of a particular size. Moreover, the resistance of the resistance element RE may be controlled by adjusting the thickness and line width of the metal layer 84R. The resistive body of the resistance element RE may be formed with both the metal layer 84R and diffusion layer.

FIG. 17A illustrates a plane view of a resistance element as the back surface side passive element, and FIG. 17B a cross-sectional view of the resistance element of FIG. 17A.

As illustrated in FIGS. 17A and 17B, the resistance element RE with a metal layer 84R as the resistive body therein may be coupled between two peripheral circuits CC1 and CC2 at the front surface FS side of the semiconductor substrate 30, as in the example illustrated in FIGS. 15A and 15B.

FIGS. 18A and 18B to FIG. 20 illustrate examples of a capacitance element at the back surface side of the semiconductor substrate in the image sensor of the present embodiment.

FIG. 18A illustrates a plane view of a capacitance element as the back surface side passive element, and FIG. 18B a cross-sectional view of the capacitance element of FIG. 18A.

As illustrated in FIGS. 18A and 18B, the back surface side capacitance element CE includes a diffusion layer 83C, a metal layer 84C, and an insulator (or, dielectric) 88C between the diffusion layer 83C and metal layer 84C.

The diffusion layer 83C as a component (or, electrode) of the capacitance element CE is provided in the semiconductor substrate 30 at the back surface side of the semiconductor substrate 30.

The diffusion layer 83C as a component of the capacitance element CE serves as, for example, an electrode (or, capacitor electrode) of the capacitance element CE. For a case of the diffusion layer 83C being used as a capacitor electrode, the diffusion layer 83C as the capacitor electrode of the capacitance element CE desirably has a high impurity-concentration for a reduced resistance of the diffusion layer 83C. The conductivity type of the diffusion layer 83C as the capacitor electrode can be suitably determined in accordance with the property of the capacitance element CE, or the conductivity type of the semiconductor region in which the diffusion layer 83C is provided.

The insulator (or, capacitor insulator) 88C is provided on the diffusion layer 83C at the back surface BS side of the semiconductor substrate 30. The metal layer 84C as a capacitor electrode is provided on the capacitor insulator 88C at the back surface BS side of the semiconductor substrate 30. The diffusion layer 83C and metal layer 84C as opposing electrodes of the back surface side capacitance element CE are opposite each other, with the insulator 89C therebetween.

In order to form the capacitance element CE of a predetermined electric capacity, at least one of an area by which the diffusion layer 83C and metal layer 84 as the electrodes of the capacitance element CE overlap, the thickness of the capacitor insulator 88C, and the material (or, dielectric constant) of the capacitor insulator 88C is controlled.

The metal layer 84C as the capacitor electrode is coupled to the back surface side pad 81 via the plug 85A and a metal layer (or, a terminal of an element and the back surface side interconnect) 81F. The back surface side pad 81 is in direct contact with the metal layer 81F. With this, the metal layer 84C as one of capacitor electrodes of the capacitance element CE is coupled to an element (not shown) outside the image sensor 100 via the back surface side pad 81. The materials of the metal layers 81F and 81E may be the same as or different from that of the back surface side pad 81.

The diffusion layer 83C is coupled to the through electrodes 82 via the plugs 85B and 85C and the metal layer (or, a terminal of an element and the back surface side interconnect) 81E. With this, the diffusion layer 83C as the other of the capacitor electrodes of the capacitance element CE is coupled to the element (for example, transistor) 7 of a peripheral circuit CC at the front surface FS side of the semiconductor substrate 30 via the through electrodes 82.

As illustrated in FIGS. 18A and 18B, the capacitance element CE provided by the diffusion layer 83 is coupled between the back surface side pad 81 at the back surface BS side of the image sensor 100 and the peripheral circuit CC at the front surface FS side of the image sensor 100.

The back surface side capacitance element CE may be a MOS capacitor which includes the semiconductor region (for example, an intrinsic region or a low concentration impurity region) 83C, metal layer 84C, and capacitor insulator 89C between the semiconductor region 83C and metal layer 84C at the back surface side of the semiconductor substrate 30. In the MOS capacitors as the back surface side passive element, a high concentration impurity region (not shown) is desirably provided in the semiconductor region 83C where the contact unit of the semiconductor region 83C and plug 85B are in contact in order to reduce a contact resistance between the low-concentration semiconductor region 83C and plug 85B.

Moreover, the back surface side capacitance element CE may be formed without the capacitor insulator but as a capacitance element with the junction capacitance of the diffusion layer.

FIG. 19A illustrates a plane view of a capacitance element as the back surface side passive element, and FIG. 19B a cross-sectional view of the capacitance element of FIG. 19A.

As illustrated in FIGS. 19A and 19B, the back surface side capacitance element CE may be coupled to two peripheral circuits CC1 and CC2 at the front surface FS side of the semiconductor substrate 30. The diffusion layer 83C as a capacitor electrode is coupled to the transistor 7 of the peripheral circuit CC1 via through electrodes 82. The metal layer 84C as another capacitor electrode is coupled to the transistor 7 of the peripheral circuit CC2 via through electrodes 82.

Thus, the back surface side capacitance element CE included in the image sensor of the present embodiment is coupled between two peripheral circuits CC1 and CC2 at the front surface FS side of the semiconductor substrate 30.

FIG. 20 illustrates a cross-sectional view of a capacitance element as the back surface side passive element. As illustrated in FIG. 20, the back surface side capacitance element CE may be formed with two opposing metal layers 84C and 84D as capacitor electrodes, and the insulator 88C between the metal layers 84C and 84D.

The back surface side passive elements CE and RE of the structures of FIGS. 14A and 14B to FIG. 20 are formed with substantially the same manufacturing method as the back surface side passive elements in the image sensor of the embodiment described with reference to FIGS. 1 to 13. Therefore, the description for the method of manufacturing the back surface side passive elements is omitted.

As described above, in the image sensor of the present embodiment, the back surface BS side of the semiconductor substrate 30 is provided with at least one of the resistance elements RE or capacitance element CE as the back surface side passive element with the structures illustrated in FIGS. 14A and 14B to FIG. 20.

The elements CE and RE are provided at the back surface BS side of the semiconductor substrate 30 according to the present embodiment, and therefore the chip size of the image sensor 100 and the camera module with the image sensor 100 of the present embodiment therein can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
   a semiconductor substrate comprising a first surface and a second surface opposite the first surface;
   a circuit at a side of the first surface of the semiconductor substrate;
   a pixel in the semiconductor substrate and converting light from a side of the second surface into electric charge, the pixel comprising a photo diode in the semiconductor substrate at the side of the first surface, the photo diode comprising a diffusion layer in an impurity region in the semiconductor substrate at the side of the first surface;
   an element at a side of the second surface of the semiconductor substrate, the element facing the circuit through the semiconductor substrate, the element comprising a resistance element which comprises a diffusion layer in the semiconductor substrate at the side of the second surface or a conductive layer above the second surface, and a pad above the second surface, wherein at least part of the pad and at least part of the element are formed with substantially the same material.

2. The device of claim 1, wherein the semiconductor substrate includes a pixel area including the pixel and a circuit area adjacent the pixel area, and the circuit and element are provided in the circuit area.

3. The device of claim 2, wherein the element is coupled to at least one of the circuit and the pad above the second surface.

4. A solid state imaging device comprising:

a semiconductor substrate comprising a first surface and a second surface opposite the first surface;

a circuit at a side of the first surface of the semiconductor substrate;

a pixel in the semiconductor substrate and converting light from a side of the second surface into electric charge, the pixel comprising a photo diode in the semiconductor substrate at the side of the first surface, the photo diode comprising a diffusion layer in an impurity region in the semiconductor substrate at the side of the first surface;

an element at a side of the second surface of the semiconductor substrate, the element facing the circuit through the semiconductor substrate, the element comprising a capacitance element which comprises:

a diffusion layer in the semiconductor substrate at the side of the second surface or a first conductor on the second surface;

an insulator on the diffusion layer or first conductor; and a second conductor on the insulator, and a pad above the second surface, wherein at least part of the pad and at least part of the element are formed with substantially the same material.

5. The device of claim 1, further comprising a lens which faces the photo diode above the second surface.

6. The device of claim 1, wherein the element is provided to vertically overlap the circuit in a direction perpendicular to at least one of the first and second surfaces.

7. The device of claim 4, wherein the element is provided to vertically overlap the circuit in a direction perpendicular to at least one of the first and second surfaces.

8. The device of claim 4, further comprising a lens which faces the photo diode above the second surface.

* * * * *